(12) United States Patent
Kim et al.

(10) Patent No.: US 10,576,582 B2
(45) Date of Patent: Mar. 3, 2020

(54) SPOT HEATER AND DEVICE FOR CLEANING WAFER USING THE SAME

(71) Applicant: SAMSUNG ELECTRONICS CO., LTD., Suwon-si (KR)

(72) Inventors: Young-Hoo Kim, Yongin-si (KR); Il-Sang Lee, Hwaseong-si (KR); Yong-sun Ko, Suwon-si (KR); Chang-Gil Ryu, Yongin-si (KR); Kun-Tack Lee, Suwon-si (KR); Hyo-San Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/029,828

(22) Filed: Jul. 9, 2018

(65) Prior Publication Data

US 2018/0311764 A1 Nov. 1, 2018

Related U.S. Application Data

(63) Continuation of application No. 14/706,546, filed on May 7, 2015, now Pat. No. 10,029,332.

(30) Foreign Application Priority Data

Sep. 4, 2014 (KR) ........................ 10-2014-0117800

(51) Int. Cl.
*H01L 21/00* (2006.01)
*B23K 26/146* (2014.01)
(Continued)

(52) U.S. Cl.
CPC .............. *B23K 26/146* (2015.10); *B08B 3/10* (2013.01); *B08B 7/0071* (2013.01);
(Continued)

(58) Field of Classification Search
CPC ........... H01L 21/67028; H01L 21/6708; H01L 21/67115; B23K 26/146; B08B 3/10; B08B 7/0071
USPC ....... 134/105, 19, 1.3, 1, 99.1, 26, 184, 198, 134/21; 118/725, 724, 715; 392/416, 392/418, 411
See application file for complete search history.

(56) References Cited

U.S. PATENT DOCUMENTS

| | | | | |
|---|---|---|---|---|
| 4,149,062 A | * | 4/1979 | Limmer | ............. B23K 26/1423 219/121.68 |
| 4,491,719 A | * | 1/1985 | Corby, Jr. | ............ B23K 9/0956 219/124.34 |

(Continued)

FOREIGN PATENT DOCUMENTS

| | | |
|---|---|---|
| JP | 2009-233493 A | 10/2009 |
| JP | 5031984 B2 | 9/2012 |

(Continued)

*Primary Examiner* — David G Cormier
*Assistant Examiner* — Thomas Bucci
(74) *Attorney, Agent, or Firm* — Sughrue Mion, PLLC

(57) ABSTRACT

A spot heater and a device for cleaning a wafer using the same are provided. The wafer cleaning device includes a heater chuck on which a wafer is mounted, the heater chuck configured to heat a bottom surface of the wafer; a chemical liquid nozzle configured to spray a chemical liquid on a top surface of the wafer for etching; and a spot heater configured to heat a spot of the top surface of the wafer.

12 Claims, 17 Drawing Sheets

(51) Int. Cl.
- *B08B 7/00* (2006.01)
- *B08B 3/10* (2006.01)
- *C11D 11/00* (2006.01)
- *H01L 21/67* (2006.01)
- *H01L 21/687* (2006.01)

(52) U.S. Cl.
CPC ...... *C11D 11/0047* (2013.01); *H01L 21/6708* (2013.01); *H01L 21/67028* (2013.01); *H01L 21/67109* (2013.01); *H01L 21/67115* (2013.01); *H01L 21/67248* (2013.01); *H01L 21/67253* (2013.01); *H01L 21/68785* (2013.01); *H01L 21/68792* (2013.01)

(56) References Cited

U.S. PATENT DOCUMENTS

| | | | | |
|---|---|---|---|---|
| 4,599,506 | A * | 7/1986 | Burke | B23K 9/095 219/124.34 |
| 4,774,392 | A * | 9/1988 | Orita | B08B 15/04 219/121.63 |
| 4,859,829 | A * | 8/1989 | Dufour | B23K 9/0956 219/124.34 |
| 4,942,284 | A * | 7/1990 | Etcheparre | B08B 15/04 219/121.67 |
| 4,987,007 | A * | 1/1991 | Wagal | C23C 14/28 427/526 |
| 5,475,198 | A * | 12/1995 | Burke | B23K 9/1274 219/124.34 |
| 5,486,676 | A * | 1/1996 | Aleshin | B23K 26/144 219/121.63 |
| 5,898,522 | A * | 4/1999 | Herpst | G02B 7/007 359/511 |
| 5,977,515 | A * | 11/1999 | Uraki | B23K 26/067 219/121.84 |
| 6,252,648 | B1 * | 6/2001 | Hase | G02B 27/0006 355/53 |
| 6,270,222 | B1 * | 8/2001 | Herpst | G02B 27/0006 359/511 |
| 6,717,158 | B1 | 4/2004 | Gat et al. | |
| 6,771,895 | B2 | 8/2004 | Gat et al. | |
| 7,038,174 | B2 | 5/2006 | Gat et al. | |
| 7,138,640 | B1 * | 11/2006 | Delgado | G01N 21/15 250/372 |
| 7,456,370 | B2 * | 11/2008 | Beeson | B23K 26/0884 219/121.63 |
| 7,608,802 | B2 | 10/2009 | Gat et al. | |
| 7,731,798 | B2 | 6/2010 | Shareef et al. | |
| 8,053,701 | B2 * | 11/2011 | Will | B23K 26/12 219/121.63 |
| 8,097,825 | B2 * | 1/2012 | Sato | B23K 26/103 219/64 |
| 8,138,451 | B2 | 3/2012 | Gat et al. | |
| 8,222,574 | B2 | 7/2012 | Sorabji et al. | |
| 8,449,806 | B2 * | 5/2013 | Miyairi | B23K 26/0853 264/400 |
| 8,536,492 | B2 | 9/2013 | Raamurthy et al. | |
| 2003/0164365 | A1 | 9/2003 | Ito et al. | |
| 2003/0197909 | A1 * | 10/2003 | Beyer | B08B 15/04 359/509 |
| 2004/0020898 | A1 * | 2/2004 | Uziel | B08B 7/0035 216/58 |
| 2006/0060213 | A1 * | 3/2006 | Huber | B08B 7/0042 134/2 |
| 2006/0113290 | A1 * | 6/2006 | Shareef | B23K 26/703 219/121.82 |
| 2006/0192968 | A1 * | 8/2006 | Farrant | G01N 21/15 356/445 |
| 2007/0051710 | A1 * | 3/2007 | Odanaka | B08B 15/04 219/121.84 |
| 2007/0163715 | A1 * | 7/2007 | Rastegar | B08B 3/024 156/345.5 |
| 2009/0207494 | A1 * | 8/2009 | Gelbart | A61B 1/126 359/509 |
| 2010/0307686 | A1 | 12/2010 | Iizuka et al. | |
| 2011/0073142 | A1 * | 3/2011 | Hattori | B60S 1/0848 134/56 R |
| 2011/0089151 | A1 * | 4/2011 | Miyagi | B23K 26/147 219/121.66 |
| 2012/0138097 | A1 * | 6/2012 | Okorn-Schmidt | H01L 21/67115 134/19 |
| 2012/0145683 | A1 * | 6/2012 | Miyagi | B23K 26/147 219/121.64 |
| 2012/0288970 | A1 | 11/2012 | Hashimoto et al. | |
| 2013/0061873 | A1 | 3/2013 | Hohenwarter et al. | |
| 2013/0146572 | A1 * | 6/2013 | Watanabe | B23K 26/0648 219/121.72 |
| 2013/0260574 | A1 | 10/2013 | Masuhara et al. | |
| 2013/0323936 | A1 | 12/2013 | Ranish et al. | |
| 2014/0060573 | A1 * | 3/2014 | Yoshida | H01L 21/02082 134/1.3 |
| 2014/0102637 | A1 | 4/2014 | Brugger et al. | |
| 2014/0204461 | A1 * | 7/2014 | Imai | G01J 3/0291 359/513 |
| 2014/0346155 | A1 * | 11/2014 | Jurca | B23K 26/032 219/121.74 |
| 2015/0068557 | A1 * | 3/2015 | Negoro | B08B 3/10 134/19 |
| 2015/0122787 | A1 * | 5/2015 | Patton, Jr. | B23K 9/322 219/124.4 |
| 2015/0258582 | A1 * | 9/2015 | Hashizume | H01L 21/67051 156/345.15 |

FOREIGN PATENT DOCUMENTS

| | | |
|---|---|---|
| JP | 2013-145806 A | 7/2013 |
| JP | 2013-207042 A | 10/2013 |
| KR | 10-0395662 B1 | 8/2003 |
| KR | 10-0729006 B1 | 6/2007 |
| KR | 10-0849367 B1 | 7/2008 |
| KR | 10-2010-0131354 A | 12/2010 |
| WO | 2013/105575 A1 | 7/2013 |

\* cited by examiner

SPOT HEATER AND DEVICE FOR CLEANING WAFER USING THE SAME

CROSS-REFERENCE TO RELATED APPLICATION

This application is a continuation of U.S. patent application Ser. No. 14/706,546, filed on May 7, 2015, in the U.S. Patent and Trademark Office, which claims priority from Korean Patent Application No. 10-2014-0117800 filed on Sep. 4, 2014, in the Korean Intellectual Property Office, and all the benefits accruing therefrom under 35 U.S.C. 119, the contents of which in its entirety are herein incorporated by reference.

BACKGROUND

1. Field

Apparatuses consistent with exemplary embodiments relate to a spot heater and a device for cleaning a wafer using the same.

2. Description of the Related Art

In a wet cleaning process, an essential process in a semiconductor manufacturing process, hard masks formed on a wafer are etched by a chemical liquid of a high temperature. In the related art, the wet cleaning process is performed using a batch type device. The batch type device refers to wet cleaning equipment for cleaning a plurality of wafers as a set, not a single wafer, by simultaneously precipitating a set of wafers in a chemical liquid.

However, the batch type device may experience several problems with wafers. For example, the batch type device may experience the problems including defects in flowability, drying failures, deterioration in distribution uniformity, and so on. Therefore, in order to mitigate the problems, attempts to replace the batch type device with a single type device have been encouraged. The single type device refers to equipment in which a single wafer is independently subjected to a wet cleaning process.

However, the single type device may experience a problem of non-uniform etch rate (E/R) distribution depending on the position of a single wafer. Therefore, it is necessary to develop a wafer cleaning device, which can provide a uniform E/R distribution according to the position of wafer.

SUMMARY

One or more exemplary embodiments provide a device for cleaning a wafer, which can provide a uniform distribution of etch rates (E/R) of the wafer.

One or more exemplary embodiments also provide a spot heater, which can provide a uniform distribution of etch rates of the wafer.

These and other aspects of the inventive concept will be described in or be apparent from the following description of exemplary embodiments.

According to an aspect of an exemplary embodiment, there is provided a device for cleaning wafer, the device including a heater chuck on which a wafer is mounted and which heats the wafer under the wafer, a chemical liquid nozzle for spraying a chemical liquid for etching a top surface of the wafer to the top surface of the wafer, and a spot heater heating a spot of the top surface of the wafer.

The heater chuck comprises a top plate supporting the wafer and including a ring-shaped first region and a ring-shaped second region surrounding the first region; a first ring heater heating the first region under the top plate; and a second ring heater heating the second region under the top plate.

The first and second ring heaters are independently controlled.

The spot heater heats the wafer by irradiating the spot with laser light.

The laser light has a wavelength in a near infrared (NIR) region.

The spot heater comprises a laser source supplying the laser light; and a filter configured to overlap with an irradiating direction of the laser source and adjusting a size of the spot.

The spot heater comprises a laser source supplying the laser light and a vertical position adjusting device adjusting a size of the spot by adjusting a vertical position of the laser source.

The spot heater heats an edge region of the wafer.

The edge region has a width ranging from 1 mm to 10 mm.

The heater chuck comprises a top plate supporting the wafer, a ring heater heating the top plate under the top plate, a spin chuck assembly accommodating the ring heater; and a spin motor assembly positioned under the spin chuck assembly and rotating the spin chuck assembly and the top plate.

The spin chuck assembly includes a first hole, the spin motor assembly includes a second hole coupled to the first hole, the heater chuck further includes a fixing shaft coupled to the ring heater while passing through the first and second holes, and the fixing shaft and the ring heater are fixed while the spin motor assembly and the spin chuck assembly rotate.

The spot heater comprises a heating source supplying heat; and a cover unit isolating the heating source from the chemical liquid or fumes of the chemical liquid.

The cover unit includes a purge part for removing foreign materials from the inside of the cover unit and the heating source.

According to an aspect of another exemplary embodiment, there is provided a device for cleaning wafer, the device including a heater chuck on which a wafer is mounted and which includes first to sixth ring heaters heating first to sixth regions of the wafer under the wafer, and a plurality of spot heaters heating at least a portion of the wafer from a top surface of the wafer.

The plurality of spot heaters heat boundaries between each of the first to sixth regions.

The device for cleaning wafer may further comprising a controller receiving an etch rate profile and adjusting at least one of outputs, heights and horizontal positions of the plurality of spot heaters to control an etch rate of the wafer.

According to an aspect of another exemplary embodiment, there is provided a spot heater of a wafer cleaning device including a heater chuck heating a wafer mounted on its top surface and a chemical liquid nozzle for spraying a chemical liquid for etching the top surface of the wafer, the spot heater including a heating source heating a spot on the wafer from the top surface of the wafer, and a support arm for supporting the heating source.

The heating source includes a laser source supplying laser light.

The support arm fixes the laser source to allow the laser light to be irradiated into an edge area of the wafer.

The support arm adjusts a position of the heating source.

The spot heater may further comprising a temperature sensor sensing a temperature of the wafer; and a controller receiving the temperature of the wafer to determine the position of the heating source and driving the support arm.

According to an aspect of an exemplary embodiment, there is provided a device for cleaning wafer including: a heater chuck on which a wafer is mounted, the heater chuck configured to heat a bottom surface of the wafer; a chemical liquid nozzle configured to spray a chemical liquid on a top surface of the wafer for etching; and a spot heater configured to heat a spot of the top surface of the wafer.

The heater chuck may include: a top plate supporting the wafer and including: a ring-shaped first region; and a ring-shaped second region surrounding the first region; a first ring heater configured to heat the first region from underneath the top plate; and a second ring heater configured to heat the second region from underneath the top plate.

The device may further include a controller configured to independently control the first and the second ring heaters.

The spot heater may be configured to irradiate the spot with laser light and heat the wafer.

The laser light may have a wavelength in a near infrared (NIR) region.

The spot heater may include: a laser source configured to supply the laser light; and a filter provided between the laser source and the irradiated spot and configured to adjust a size of the irradiated spot.

The spot heater may include: a laser source configured to supply the laser light; and a vertical position adjusting device configured to adjust a size of the irradiated spot by adjusting a vertical position of the laser source.

The spot heater may be configured to heat an edge region of the wafer.

The heater chuck may include: a top plate supporting the wafer; a ring heater configured to heat the top plate from underneath the top plate; a spin chuck assembly accommodating the ring heater; and a spin motor assembly positioned under the spin chuck assembly and configured to rotate the spin chuck assembly and the top plate.

The spin chuck assembly may include a first hole, wherein the spin motor assembly may include a second hole aligned with the first hole, wherein the heater chuck may further include a fixing shaft coupled to the ring heater and passing through the first and second holes, and wherein the fixing shaft and the ring heater may be fixedly attached while the spin motor assembly and the spin chuck assembly rotate.

The spot heater may include: a heating source configured to supply heat; and a cover unit configured to isolate the heating source from the chemical liquid or fumes of the chemical liquid.

The cover unit may include a purge part configured to remove foreign materials from the inside of the cover unit and the heating source.

According to an aspect of an exemplary embodiment, there is provided a spot heater of a wafer cleaning device including a heater chuck heating a wafer mounted on a top surface of the heater chuck and a chemical liquid nozzle for spraying a chemical liquid for etching a top surface of the wafer where the spot heater may include: a heating source configured to heat a spot on the top surface of the wafer; and a support arm for supporting the heating source.

The heating source may include a laser source configured to generate laser light.

According to an aspect of an exemplary embodiment, there is provided a device for cleaning a wafer including: a first heater accommodating a wafer and configured to heat the wafer from a first side of the wafer; and a second heater configured to heat the wafer from a second side of wafer, the second side being opposite from the first side.

The first heater may be configured to heat a first region of the wafer and the second heater is configured to heat a second region of the wafer, and the first region may be larger than the second region.

The second heater may include a plurality of second heaters configured to heat the wafer from the second side of the wafer, and the plurality of second heaters may be configured to heat a second region including an edge region of the wafer.

The first heater may include a plurality of first heaters configured to heat the wafer from the first side of the wafer, and the plurality of the first heaters may be configured to heat a first region provided between a center region of the wafer and an edge region of the wafer.

BRIEF DESCRIPTION OF THE DRAWINGS

The above and/or other aspects of the disclosure will become apparent by describing in detail exemplary embodiments thereof with reference to the attached drawings in which.

DETAILED DESCRIPTION OF THE EMBODIMENTS

Figure 1:
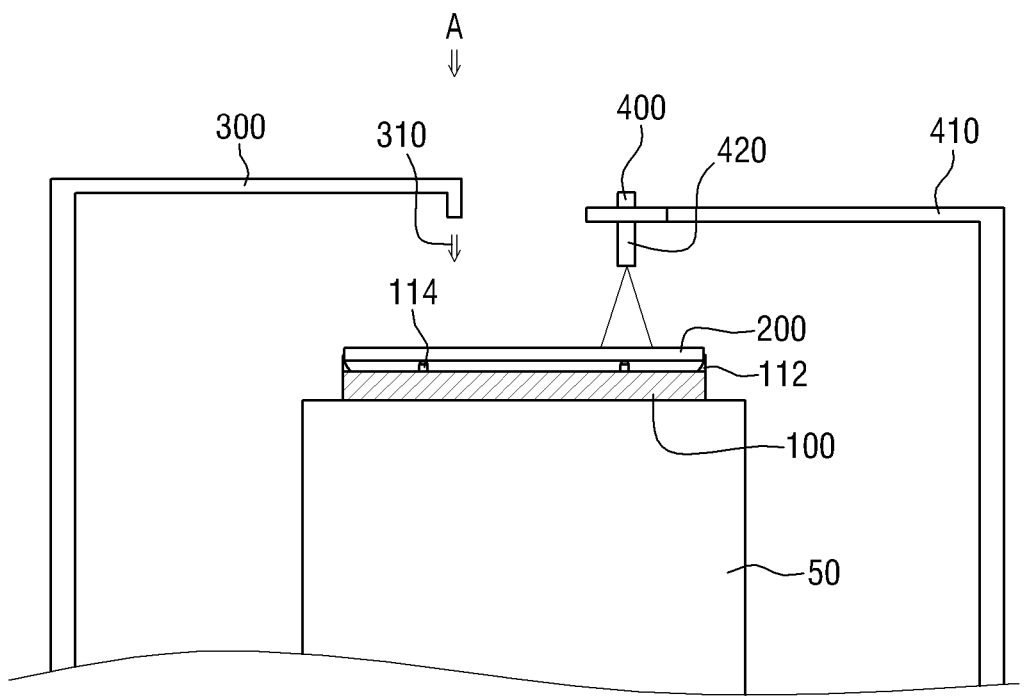
FIG. 1 is a side view for explaining a configuration of a wafer cleaning device according to an exemplary embodiment.

Advantages and features of the inventive concept and methods of accomplishing the same may be understood more readily by reference to the following detailed description of exemplary embodiments and the accompanying drawings. The inventive concept may, however, be embodied in many different forms and should not be construed as being limited to the exemplary embodiments set forth herein. Rather, the exemplary embodiments are provided so that this disclosure will be thorough and complete and will fully convey the concept of the inventive concept to those skilled in the art, and the inventive concept will only be defined by the appended claims. Like reference numerals refer to like elements throughout the specification.

The terminology used herein is for the purpose of describing particular exemplary embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Exemplary embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a wafer cleaning device according to a first exemplary embodiment will be described with reference to FIGS. 1 to 8.

FIG. 1 is a side view for explaining a configuration of a wafer cleaning device according to a first exemplary embodiment.

Referring to FIG. 1, the wafer cleaning device according to the first exemplary embodiment includes a table 50, a heater chuck 100, a chemical liquid nozzle 300 and a spot heater 400.

The table 50 may be a supporting part for supporting the wafer 200. The table 50 may support the wafer 200 and the heater chuck 100 which directly supports the wafer 200. That is, the heater chuck 100 is provided between the wafer 200 and the table 50. The table 50 may have a predetermined accommodating space on a top surface or in an interior part of the table 50 on which the heater chuck 100 is installed. Accordingly, the heater chuck 100 may be installed on the top surface of the table 50 or in the interior art of the table 50. A portion of the heater chuck 100 may be accommodated in the accommodating space of the table 50 and the remaining portion of the heater chuck 100 may be positioned to be protruding from the top surface of the table 50 to be exposed. However, the exemplary embodiment is not limited thereto. For example, a top surface of the heater chuck 100 may be flush with the top surface of the table 50.

The table 50 may supply the heater chuck 100 with power and an electrical control signal. That is, the table 50 may include a wiring structure for supplying the power and an electrical control signal to the heater chuck 100. However, the exemplary embodiment is not limited thereto. The heater chuck 100 may not be connected to the exterior of the wafer cleaning device but may acquire driving power on its own using, for example, batteries.

The heater chuck 100 may be installed on the table 50. The heater chuck 100 may support the wafer 200 on a top surface thereof. Therefore, the top surface of the heater chuck 100 may be exposed/protruding from the table 50. The heater chuck 100 may support the wafer 200. Accordingly, the wafer 200 may be supported on the heater chuck 100 until the wet cleaning process is finished.

A plurality of wafers 200 may be mounted on the heater chuck 100 one by one. That is, the wafer cleaning device according to the first exemplary embodiment may not be a batch type device but of a single type device. The heater chuck 100 may heat the wafer 200 from below the wafer 200 (i.e. the heater chuck 100 may heat a bottom surface of the wafer 200). The heater chuck 100 may clean a top surface of the wafer 200 by heating the wafer 200 using a chemical liquid 310 of a high temperature. Here, the term "clean" corresponds to removing a hard mask from the top surface of the wafer 200.

The chemical liquid nozzle 300 may supply the chemical liquid 310 to the top surface of the wafer 200 positioned on the top surface of the heater chuck 100. The chemical liquid 310 may be a liquid for removing a hard mask from the top surface of the wafer 200. The chemical liquid 310 may be, for example, phosphoric acid. However, the exemplary embodiment is not limited thereto.

The wafer 200 may have a hard mask remaining on the top surface of the wafer 200 to be used in etching performed after patterning is finished. In this case, a process for removing the remaining hard mask is necessary and a wet cleaning process cleans/removes the remaining hard mask. The hard mask may include, for example, a nitride-series material, but the exemplary embodiment is not limited thereto. Any kind of liquid can be used as the chemical liquid 310 without limitation so long as the liquid is capable of etching the hard mask.

The chemical liquid nozzle 300 may supply the chemical liquid 310 to the top surface of the wafer 200. In detail, the chemical liquid nozzle 300 may spray the chemical liquid 310 to the top surface of the wafer 200. However, the exemplary embodiment is not limited thereto. The chemical liquid 310 may be supplied to the top surface of the wafer 200 by any method without limitation so long as the chemical liquid 310 can be supplied. For example, the chemical liquid nozzle 300 may supply the chemical liquid 310 to the top surface of the wafer 200 simply by dripping the chemical liquid 310.

The spot heater 400 may heat a spot/a region on the top surface of the wafer 200. Here, the term 'spot/region' may be used to mean a portion of the top surface of the wafer 200. Specifically, the 'spot/region' may be a circular region having a diameter of 1 to 10 mm or an elliptical region corresponding thereto. The entire diameter of the wafer 200 is not particularly limited but may be approximately 300 mm. Accordingly, the spot may correspond to an extremely small portion of the top surface of the wafer 200.

The spot heater 400 may heat the top surface of the wafer 200. The spot heater 400 may be positioned above the wafer 200 to be overlapped with the wafer 200. The spot heater 400 may include a heating source 420 and a support arm 410.

The heating source 420 may supply heat. The heating source 420 may be a light irradiating device. However, the exemplary embodiment is not limited thereto. The heating source 420 may heat a spot/a region on the top surface of the wafer 200 from above the wafer 200. Accordingly, the wafer 200 may be supplied with heat from two separate heating sources, including the heater chuck 100 and the spot heater 400.

The heat is supplied to the wafer 200 for the purpose of etching the hard mask remaining on the top surface of the wafer 200 using the chemical liquid 310. That is, the hard mask on the top surface of the wafer 200 may be removed using the chemical liquid 310 of a high temperature. The high temperature may be in a range of room temperature to 200° C. However, the exemplary embodiment is not limited thereto.

The support arm 410 may serve as a jig for determining a position of the heating source 420. The support arm 410 may support the heating source 420. The support arm 410 may fix the heating source 420 so as to allow the heating source 420 to supply heat to the top surface of the wafer 200.

In FIG. 1, the chemical liquid nozzle 300 and the support arm 410 are illustrated as separate components. Alternatively, the chemical liquid nozzle 300 and the support arm 410 may be incorporated as a single component. That is, the chemical liquid nozzle 300 for spraying the chemical liquid 310 may be integrally formed with the support arm 410. In this case, the chemical liquid 310 may be sprayed through the chemical liquid nozzle 300 and the wafer 200 may then be heated by the heating source 420 and the heater chuck 100.

Figure 2:
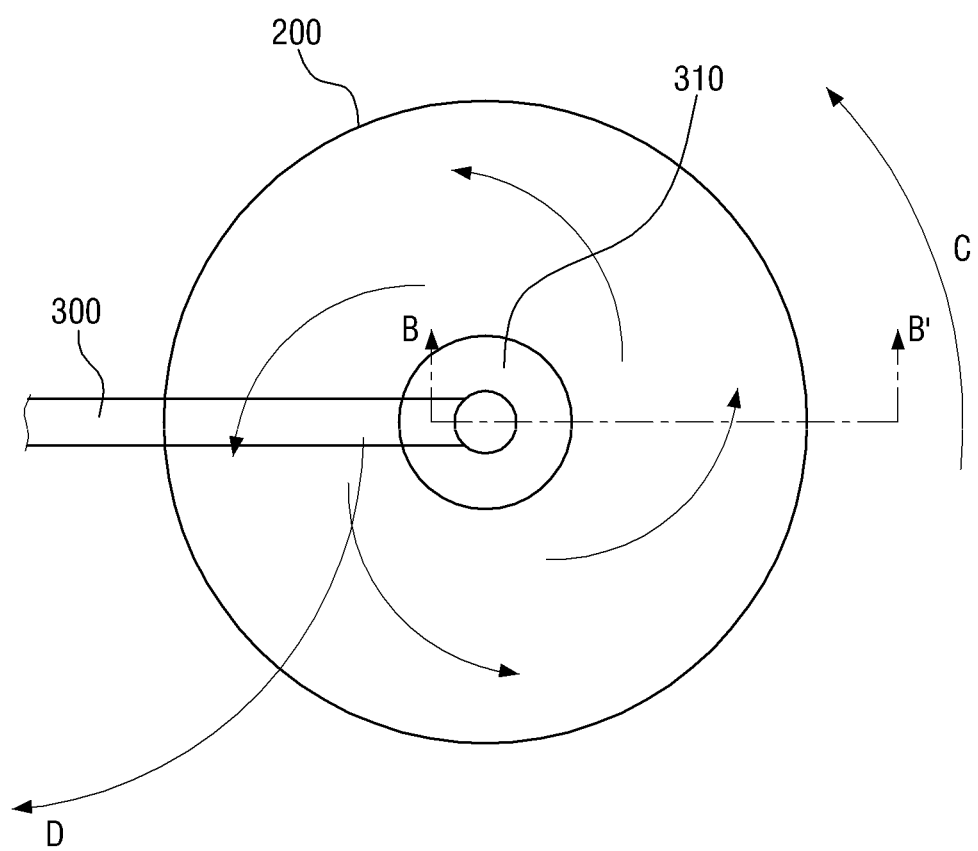
FIG. 2 is a plan view from a direction 'A' of FIG. 1 for explaining a chemical liquid nozzle and a wafer according to an exemplary embodiment.

FIG. 2 is a plan view from a direction 'A' as shown in FIG. 1 for explaining a chemical liquid nozzle and a wafer according to an exemplary embodiment.

Referring to FIG. 2, the chemical liquid nozzle 300 may supply the chemical liquid 310 to the top surface of the wafer 200. The chemical liquid nozzle 300 may spray the chemical liquid 310 to, for example, a central portion of the top surface of the wafer 200. However, the exemplary embodiment is not limited thereto. The wafer 200 may be rotated by the heater chuck 100 in a first direction C. The first direction may be, for example, a clockwise direction or a counterclockwise direction.

As the wafer 200 is rotated in the first direction C, the chemical liquid 310 may be diffused from the central portion to an edge region of the wafer 200. In FIG. 2, arrows on the wafer 200 indicate directions in which the chemical liquid 310 is diffused. The diffused directions of the chemical liquid 310 may be determined by the first direction C. However, the chemical liquid 310 may be diffused from the central portion to the edge region of the wafer 200, irrespective of whether the first direction C is clockwise or counterclockwise.

The chemical liquid nozzle 300 may be moved in a second direction D. In detail, the chemical liquid nozzle 300 may spray the chemical liquid 310 to the top surface of the wafer 200 and may then be moved on the wafer 200 so as not to overlap with the wafer 200 as shown in FIG. 2. That is to say, the chemical liquid nozzle 300 supplies the chemical liquid 310 to the top surface of the wafer 200 and may be moved in the second direction D away from the wafer 200 to prevent the chemical liquid nozzle 300 from being interfered with the spot heater 400 which heats the wafer 200 in a subsequent process. The second direction D may be, for example, a clockwise direction or a counterclockwise direction. However, the exemplary embodiment is not limited thereto.

As described above, if the chemical liquid nozzle 300 and the support arm 410 are configured as a single component, the chemical liquid nozzle 300 may not be moved. That is, the chemical liquid nozzle 300 may supply the chemical liquid 310 to the top surface of the wafer 200 and the heating source 420 may then heat the spot/region on the top surface of the wafer 200. That is to say, the support arm 410 or the chemical liquid nozzle 300 may not be necessarily moved to a position at which it is not overlapped with the top surface of the wafer 200.

Figure 3:
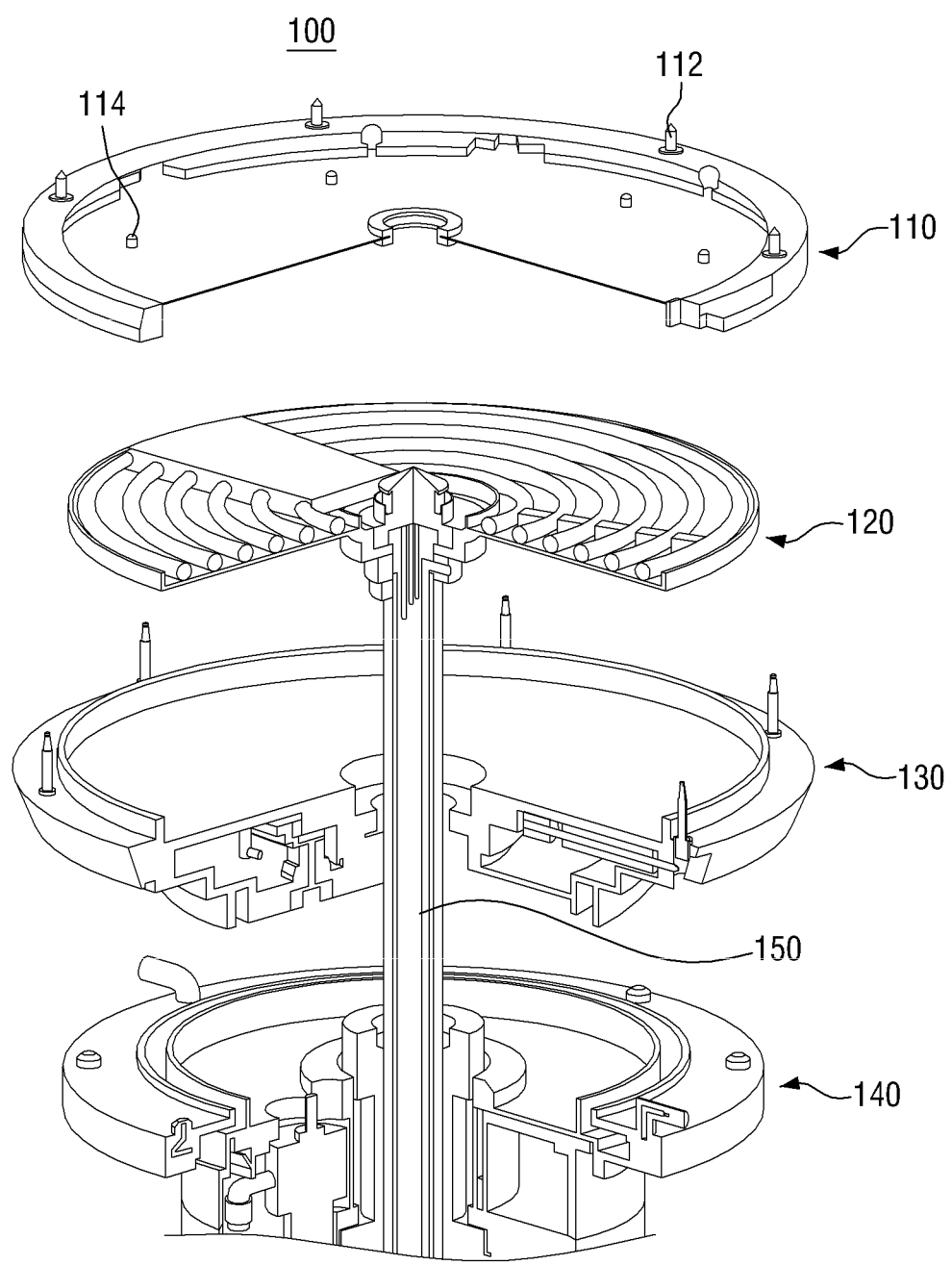
FIG. 3 is an exploded perspective view for explaining in detail a heater chuck of the wafer cleaning device shown in FIG. 1.

FIG. 3 is an exploded perspective view for explaining in detail a heater chuck 100 of the wafer cleaning device shown in FIG. 1.

The heater chuck 100 includes a top plate 110, a ring heater 120, a spin chuck assembly 130, a spin motor assembly 140 and a fixing shaft 150.

The top plate 110 may directly support the wafer 200. The wafer 200 may be mounted on the top plate 110. The top plate 110 may be a circular plate, like the wafer 200. However, the exemplary embodiment is not limited thereto. Because the top plate 110 supports the wafer 200, the top plate 110 may be wider than the wafer 200. However, the exemplary embodiment is not limited thereto.

The top plate 110 includes a wafer fixing part 112 and a wafer supporting part 114. The wafer fixing part 112 may fix the wafer 200 from the outer periphery of the wafer 200. The wafer fixing part 112 may include a plurality of wafer fixing parts. As shown in FIG. 3, the wafer fixing part 112 may be a part convexly protruding from the top plate 110. The wafer fixing part 112 may firmly fix the wafer 200 to prevent the wafer 200 from being vibrated or dislodged from the original position of the wafer 200 during a wet cleaning process.

The wafer supporting part 114 may support the wafer 200 mounted on the top plate 110. The wafer 200 may not be brought into direct contact with the top plate 110 but may be maintained at a predetermined clearance from the top plate 110 due to presence of the wafer supporting part 114. Accordingly, it is possible to prevent heat derived from the ring heater 120 from being transmitted to the wafer 200 at an excessively rapid rate. However, in an alternative exemplary embodiment, the wafer supporting part 114 may not be provided. That is, the wafer 200 and the top plate 110 may be brought into direct contact with each other.

The ring heater 120 may be positioned under the top plate 110. The ring heater 120 may supply heat to the wafer 200 from below the top plate 110. The ring heater 120 may include a plurality of ring heaters. The ring heater 120 may include a plurality of ring-shaped heaters having different diameters. As shown in FIG. 3, each of the plurality of ring-shaped heaters has different outer diameter and inner diameter from others of the plurality of ring-shaped heaters. The respective ring heaters 120 may heat different parts of the wafer 200 from below the wafer 200 along the radial direction of the wafer 200.

The ring heater 120 may be connected to the fixing shaft 150. In detail, as shown in FIG. 3, the center of the ring heater 120 may be connected to the fixing shaft 150. Because the fixing shaft 150 is not rotatable and the ring heater 120 is fixedly attached to the fixing shaft 150, the ring heater 120 may also not be rotatable. However, the exemplary embodiment is not limited thereto. For example, the ring heater 120 and the fixing shaft 150 may be rotatable with respect to each other or may be rotatable together.

The spin chuck assembly 130 may be positioned under the ring heater 120. The spin chuck assembly 130 may include a circular accommodating space provided therein. The ring heater 120 may be disposed in the accommodating space. That is, the spin chuck assembly 130 may accommodate the ring heater 120 therein. The spin chuck assembly 130 may be coupled to the top plate 110. Therefore, the ring heater 120 may be provided between the spin chuck assembly 130 and the top plate 110.

The spin chuck assembly 130 may include a first hole through which the fixing shaft 150 passes. The spin chuck assembly 130 may be rotated with the top plate 110. However, the fixing shaft 150 and the ring heater 120 may not be rotated. Therefore, an inner wall of the first hole through which the fixing shaft 150 passes and an outer surface of the fixing shaft 150 may not be brought into contact with each other.

The spin motor assembly 140 may be positioned under the spin chuck assembly 130. The spin motor assembly 140 may provide a rotating force for rotating at least one of the spin chuck assembly 130, the top plate 110 and the wafer 200. The spin motor assembly 140 may include a second hole through which the fixing shaft 150 passes. The spin motor assembly 140 may be rotated with the spin chuck assembly 130 and the top plate 110. However, the fixing shaft 150 and the ring heater 120 may not be rotated. Therefore, an inner wall of the second hole through which the fixing shaft 150 passes and an outer surface of the fixing shaft 150 may not be brought into contact with each other.

The second hole may overlap with the first hole. That is, the fixing shaft 150 may extend linearly and may pass through the second hole and the first hole. Therefore, the first hole and the second hole are lined up with each other to form a linear path for the fixing shaft 150.

Referring again to FIG. 2, the spin motor assembly 140 may rotate in the first direction C. The heater chuck 100 may rotate the wafer 200 in the first direction C by the spin motor assembly 140. As the wafer 200 is rotated, the chemical liquid 310 on the wafer 200 is diffused into edge regions of the wafer 200, thereby providing a uniform distribution of etch rates.

Referring again to FIG. 3, the fixing shaft 150 may pass through the first hole of the spin chuck assembly 130. The fixing shaft 150 may pass through the second hole of the spin motor assembly 140. The fixing shaft 150 may pass through a linear path formed by connecting the first hole with the second hole. The fixing shaft 150 may extend in a vertical direction. The fixing shaft 150 may be connected to the ring heater 120. The fixing shaft 150 may not be rotated when the spin chuck assembly 130, the spin motor assembly 140 and the top plate 110 are rotated. Because the fixing shaft 150 is not rotated, the ring heater 120 fixedly attached to the fixing shaft 150 may not be rotated. Because the ring heater 120 heats the entire surface of the top plate 110, it is not necessary rotate the ring heater 120.

Figure 4:
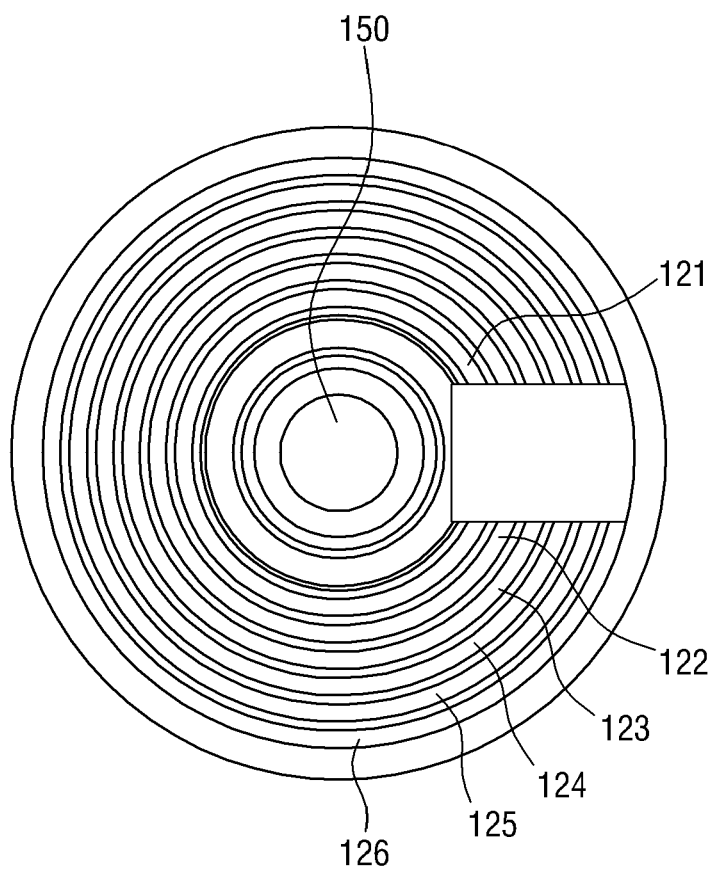
FIG. 4 is a plan view for explaining in detail a ring heater of the heater chuck shown in FIG. 3.

FIG. 4 is a plan view for explaining in detail a ring heater 120 of the heater chuck shown in FIG. 3.

Referring to FIG. 4, the ring heater 120 includes a first, a second, a third, a fourth, a fifth and a sixth ring heater 121, 122, 123, 124, 125 and 126.

The above-identified first through sixth ring heaters 121 to 126 may be concentric circular ring-shaped heaters having the same center about the fixing shaft 150. In detail, the first ring heater 121 may surround the fixing shaft 150. That is, the first ring heater 121 may be provided closest to the fixing shaft 150. The first ring heater 121 may heat a first region that is the innermost region of the wafer 200.

The second ring heater 122 may be positioned to surround the first ring heater 121. The second ring heater 122 may heat a second region surrounding the first region of the wafer 200. The first region and the second region heated by the first ring heater 121 and the second ring heater 122 may not be separated from each other but may be overlapped with each other.

Likewise, the third ring heater 123 may be provided to surround the second ring heater 122 and the fourth ring heater 124 may be provided to surround the third ring heater 123. In addition, the fifth ring heater 125 may be provided to surround the fourth ring heater 124 and the sixth ring heater 126 may be provided to surround the fifth ring heater 125 and may be positioned at the outermost region of the ring heater 120.

The third through sixth ring heaters 123 to 126 of above may heat the third through sixth regions of the wafer 200. The third region of the wafer 200 is a region surrounding the second region and the fourth region is a region surrounding the third region. The fifth region of the wafer 200 is a region surrounding the fourth region and the sixth region is a region surrounding the fifth region. That is, the third ring heater 123 may heat the third region, the fourth ring heater 124 may heat the fourth region and the fifth ring heater 125 may heat the fifth region respectively. The sixth region may be an outermost region of the wafer 200. The sixth region may be heated by the sixth ring heater 126.

The respective first through sixth ring heaters 121 through 126 may be independently controlled. That is, for example, the first ring heater 121 and the second ring heater 122 may be controlled to have different electric power. In such a manner, the temperature of the wafer 200 may be controlled to have a uniform etch rate.

In the exemplary embodiment, the ring heater 120 including six (6) ring heaters is shown. However, the exemplary embodiment is not limited thereto. For example, the number of the ring heaters 120 may be at least one. That is, the number of the ring heater 120 may be one or six or more. The more the ring heaters 120, the more finely the temperature can be controlled. However, the number of the ring heaters 120 may be restricted by physical conditions, such as areas of the ring heaters 120. That is, the inventive concept does not limit the number of ring heaters 120 so long as the aforementioned restriction can be overcome.

Figure 5:
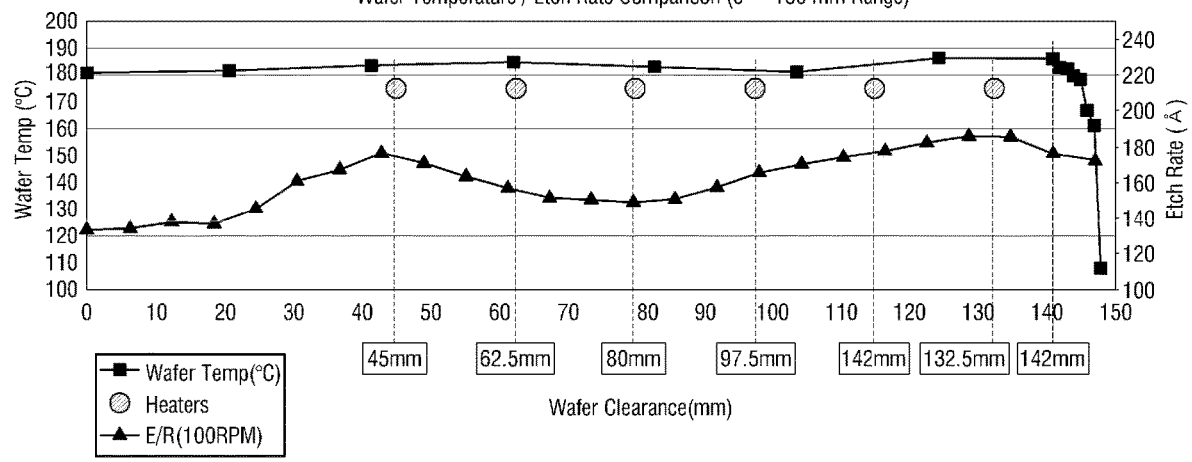
FIG. 5 is a graph illustrating distributions of temperatures and etch rates of a wafer depending on the distance from the center of the wafer according to an exemplary embodiment.

FIG. 5 is a graph illustrating distributions of temperatures and etch rates of a wafer depending on the distance from the center of the wafer.

In FIG. 5, the horizontal axis indicates a distance (mm) from the center of the wafer 200. In the exemplary embodiment, the wafer 200 has a radius of 150 mm. In FIG. 5, the vertical axis indicates the temperature (° C.) of the wafer 200 and the etch rate (Å) of the wafer 200. Circles of FIG. 5 indicate positions of ring heaters (inner ring heaters) provided within a heater chuck 100.

Referring to FIGS. 4 and 5, the wafer 200 has a constant temperature on the top surface of the wafer 200. Specifically, the constant temperature of the wafer 200 is measured in a region ranging from a location of the center (at 0 mm) of the wafer 200 to a location at an outer portion (at 142 mm) of the wafer 200. Accordingly, the wafer 200 demonstrates roughly constant etch rate on the top surface of the wafer 200, even if there may be slight fluctuations.

However, as shown in FIG. 5, the temperature of the wafer 200 is rapidly lowered from the center of the wafer 200 to an edge region exceeding 142 mm, the edge region ranging from 142 mm to 150 mm. The temperature of the wafer 200 sharply declined from approximately 180° C. to approximately 110° C. Accordingly, the etch rate on the top surface of the wafer 200 is described as a downward curve in the region exceeding 142 mm, that is, ranging from 142 mm to 150 mm.

There may be some explanations/reasons for the sharply declining temperature in the edge region of the wafer 200. First, other regions of the top surface of the wafer 200 (i.e., outside of the edge region of the wafer 200) may be heated by two ring heaters 120 positioned to be adjacent to the other regions of the top surface of the wafer 200. However, because the temperature of the edge region is controlled by only one of the plurality of ring heaters (i.e., the sixth ring heater 126 that is the outermost ring heater), the temperature at the edge region may decrease according to the increase in the distance from the sixth ring heater 126.

Next, because the sixth ring heater 126 has to be positioned in the inner part relative to the wafer fixing part 112 fixing the outermost region of the wafer 200, the edge region of the wafer 200 is positioned in the outer part relative to the sixth ring heater 126. In FIG. 5, while the sixth ring heater 126 is positioned at a region of 132.5 mm, the edge region of the wafer 200 is formed over a region ranging from 142 mm to 150 mm.

In addition, the temperature of the edge region of the wafer 200 may also be lowered by rotating the wafer 200 using the heater chuck 100 for the purpose of diffusing the chemical liquid 310. The edge region of the wafer 200 may be rotated at the same angular speed with other regions of the wafer 200. However, because the linear speed of the edge region of the wafer 200 is greater than that of the other region of the wafer 200, the edge region of the wafer 200 may have a greater air flow cooling the edge region of the wafer 200 than the other region of the wafer 200. That is, as the wafer 200 is rotated, air turbulence may be created on the top surface of the edge region of the wafer 200. Accordingly, the edge region of the wafer 200 may have a more sharply declining temperature than the other regions of the wafer 200.

At least for the three (3) reasons stated above, the temperature of the edge region of the wafer 200 may be lower than that of the other regions of the wafer 200. Accordingly, uniformity in the etch rate of the top surface of the wafer 200 may be compromised, thereby deteriorating the reliability of a semiconductor device.

Figure 6:
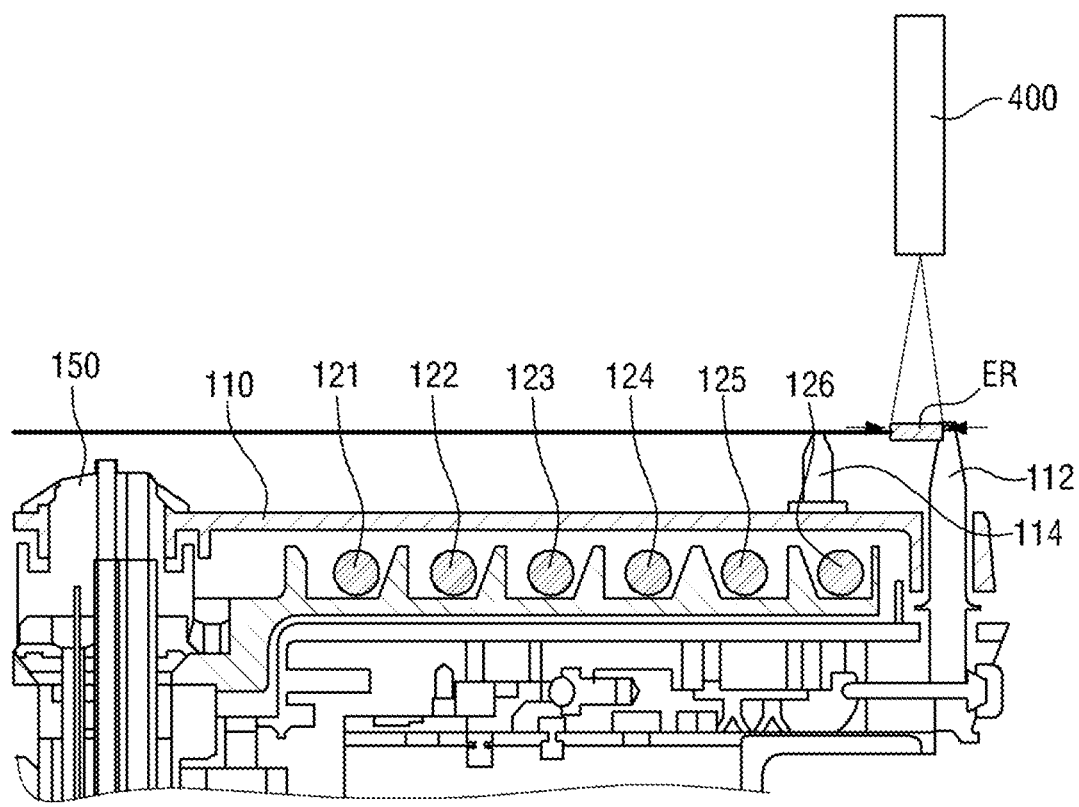
FIG. 6 is a side sectional view for explaining in detail a heater chuck and a spot heater of the wafer cleaning device shown in FIG. 1.

FIG. 6 is a side sectional view for explaining in detail a heater chuck 100 and a spot heater 400 of the wafer cleaning device shown in FIG. 1. Specifically, FIG. 6 is a cross-sectional view taken along the line B-B' of FIG. 2.

Referring to FIG. 6, the spot heater 400 may heat the edge region (ER) of the wafer 200. The wafer 200 may be mainly heated by the ring heater 120 of the heater chuck 100 and the edge region of the wafer 200 may be additionally heated by the spot heater 400. In such a case, because the temperature of the edge region is increased, the downward curve of the etch rate may be appropriately controlled.

The spot heater 400 may heat the top surface of the wafer 200 from above the wafer 200. The spot heater 400 may heat the edge region of the wafer 200. As described above, the wafer 200 may be mainly heated by the heater chuck 100 positioned below the wafer 200. In addition, the edge region of the wafer 200 may be additionally heated by the spot heater 400.

The spot heater 400 may heat the top surface of the wafer 200 by irradiating light into the top surface of the wafer 200. The spot heater 400 may heat only a part of the top surface of the wafer 200. That is, the spot heater 400 may heat a specific spot/a specific region of the top surface of the wafer 200. The specific spot/specific region of the wafer 200 may be in a range of 1 mm to 10 mm. The specific spot may be the edge region ER of the wafer 200. However, the exemplary embodiment is not limited thereto. For example, the spot heater 400 may heat a region other than the edge region ER of the wafer 200.

In the exemplary embodiment, the spot heater 400 may irradiate laser light into the edge region of the wafer 200. The laser light may have a straight directionality. By using the laser light, the spot heater 400 allows the laser light to concentrate on a spot having a smaller scale than other lamp type heater. Accordingly, the temperature of the wafer 200 can be elaborately controlled.

The spot heater 400 may irradiate light having a wavelength in a near infrared (NIR) area. The NIR light corresponds to the light having a wavelength in a range of 0.75 μm to 3 μm. Among light rays in the infrared (IR) area, the NIR light has the shortest wavelength to be positioned in an area near to the visible light area.

The spot heater 400 heats the top surface of the wafer 200 through NIR while minimizing damages caused to the wafer 200. The NIR light has a longer wavelength than the visible light and has low energy. Therefore, the top surface of the wafer 200 can be heated while minimizing damages caused to the wafer 200 by heating the spot on the top surface of the wafer 200.

Figure 7:
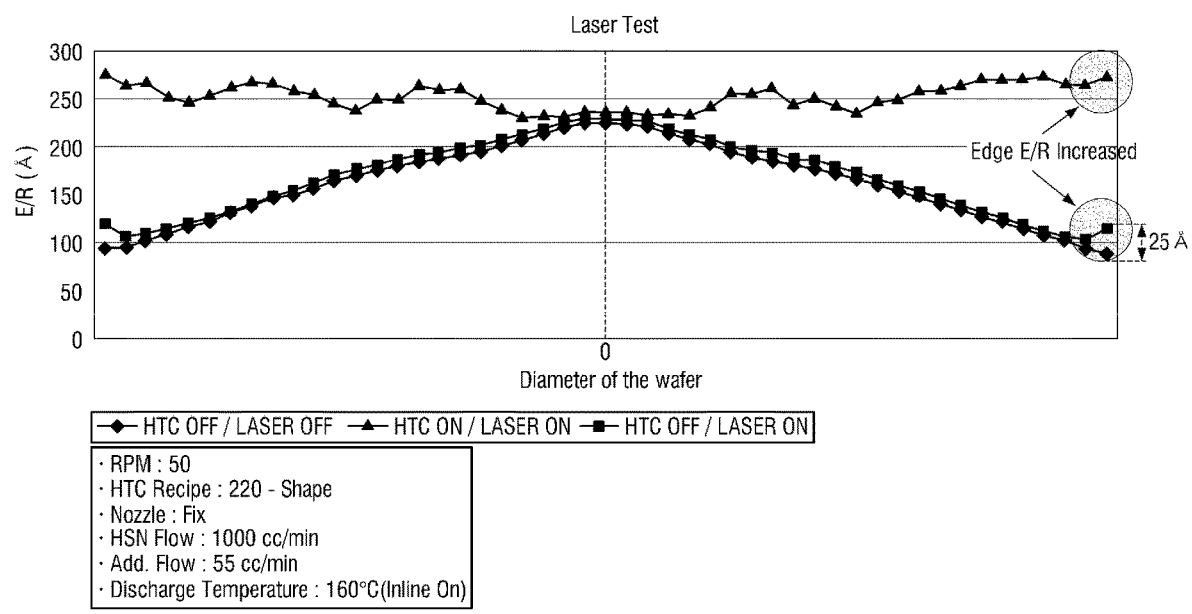
FIG. 7 is a graph illustrating etch rates at different diameters of a wafer depending on on/off states of a heater chuck and a spot heater of the wafer cleaning device shown in FIG. 1.

FIG. 7 is a graph illustrating etch rates at different diameters of a wafer depending on on/off states of a heater chuck 100 and a spot heater 400 of the wafer cleaning device shown in FIG. 1.

Referring to FIG. 7, the wafer cleaning device according to the first exemplary embodiment illustrates results under the following experimental conditions. The wafer 200 is rotated by the heater chuck 100 at a rotating speed of 50 RPM and the position of the spot heater 400 is fixed at the edge region of the wafer 200. Here, the discharge temperature of the chemical liquid is 160° C.

First, when the heater chuck 100 and the spot heater 400 are both off, the etch rate is increased at the center of the wafer 200 and is then gradually decreased toward the edge region of the wafer 200, which is because the temperature of the wafer 200 is highest at the center of the wafer 200 as a high-temperature chemical liquid is discharged. A downward curve of the etch rate is formed at the edge region of the wafer 200, like the other region of the wafer 200.

Next, when the heater chuck 100 and the spot heater 400 are both on, the experiment is carried out as follows. In this case, the etch rate is maintained at a relatively constant level throughout the entire surface of the wafer 200. In addition, an upward curve of the etch rate is formed in the edge region of the wafer 200, suggesting that the etch rate is increased as the temperature of the edge region heated by the spot heater 400 is elevated.

In order to more accurately confirm the temperature elevating effect of the edge region of the wafer 200, the experiment was carried out under the condition in which the heater chuck 100 is off and the spot heater 400 is on. In this case, the edge region of the wafer 200 generally has the same profile as the case in which the heater chuck 100 and the spot heater 400 are both off. However, it is confirmed that the etch rate was increased in the edge region by approximately 25 Å. That is, the temperature of the entire top surface of the wafer 200, including the edge region, can be adjusted by the spot heater 400, thereby more securely confirming the uniformity of etch rates.

Figure 8:
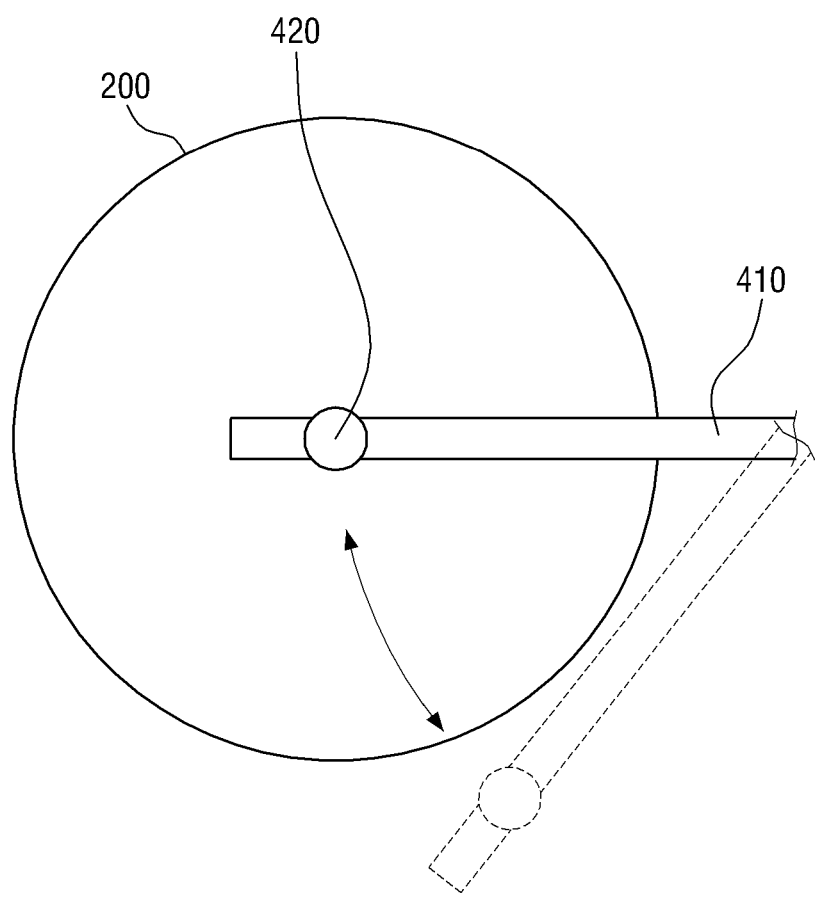
FIG. 8 is a plan view for explaining a heating source and a support arm of a spot heater of the wafer cleaning device shown in FIG. 1.

FIG. 8 is a plan view for explaining a heating source 420 and a support arm 410 of a spot heater 400 of the wafer cleaning device shown in FIG. 1.

Referring to FIG. 8, the spot heater 400 includes a heating source 420 and a support arm 410. The heating source 420 may be a source of providing heat. The heating source 420 may directly supply light to a top surface of the wafer 200. The heating source 420 may be a laser source. The heating source 420 may be fixedly positioned above the wafer 200 by the support arm 410. That is to say, the heating source 420 may heat the wafer 200 by linearly irradiating light to the top surface of the wafer 200 from the above.

The support arm 410 may support the heating source 420. The support arm 410 may fixedly position the heating source 420 so as to be positioned with respect to the wafer 200. The support arm 410 may be connected to the heating source 420 but may be separated from the wafer 200 and the heater chuck 100. The support arm 410 may be separated from the chemical liquid nozzle 300. However, in an alternative exemplary embodiment, the support arm 410 may be a single component with the chemical liquid nozzle 300. That is, the chemical liquid nozzle 300 may be integrally formed with the support arm 410 to supply a chemical liquid 310 and may support the heating source 420.

As shown in FIG. 8, the support arm 410 may change a position of the heating source 420 with respect to the top surface of the wafer 200. The heating source 420 may locally heat every part of the wafer 20 over an entire area ranging from the center of the wafer 200 to the edge region of the wafer 200, by means of the support arm 410. In detail, if the support arm 410 is moved a position of the heating source 420, the support arm 410 and the heating source 420 may be fixedly positioned with respect to the wafer 200. The heating source 420 positioned at the fixed position may heat the top surface of the wafer 200. However, the exemplary embodiment is not limited thereto. For example, the heating source 420 may heat the wafer 200 while varying the position of the support arm 410 thereby varying the position of the heating source 420.

As the support arm 410 is moved, the heating source 420 may accurately locate and heat the edge region of the wafer 200. Because the edge region of the wafer 200 varies according to the size of the wafer 200, it is necessary to horizontally move the support arm 410 above the wafer 200 to make the heating source 420 positioned at an accurate position.

In the wafer cleaning device according to the first exemplary embodiment, a uniform distribution of etch rates on the top surface of the wafer 200 may be provided. That is, a central portion of the top surface of the wafer 200 may be evenly heated by a plurality of ring heaters 120 and the edge region of the wafer 200 having a lowered temperature may be additionally heated by the spot heater 400, thereby providing a uniform etch rate distribution along the entire surface of the wafer including the edge region. If the distribution of etch rates is made uniform, the reliability in patterning the entire surface of the wafer 200 is increased, thereby remarkably increasing the reliability of a semiconductor device fabricated from the wafer 200.

Hereinafter, a wafer cleaning device according to an exemplary embodiment will be described with reference to FIGS. 9 and 10. Substantially the same description with the previous exemplary embodiment will not be repeated or will be briefly given.

Figure 9:
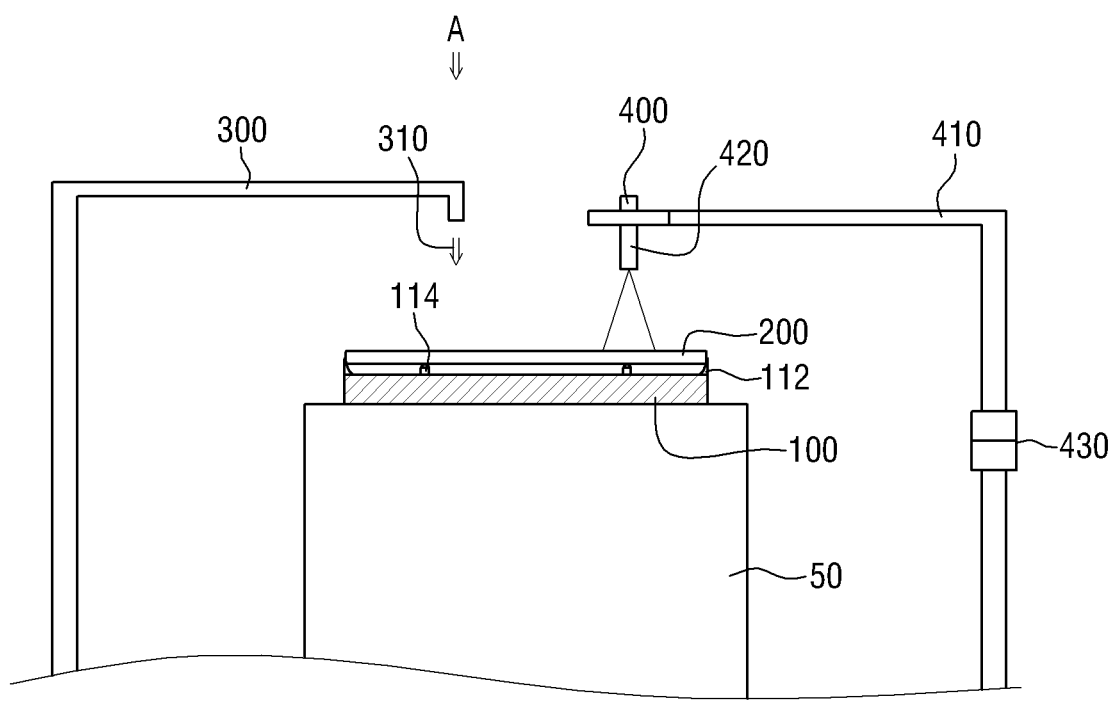
FIG. 9 is a side view for explaining a configuration of a wafer cleaning device according to an exemplary embodiment.
Figure 10:
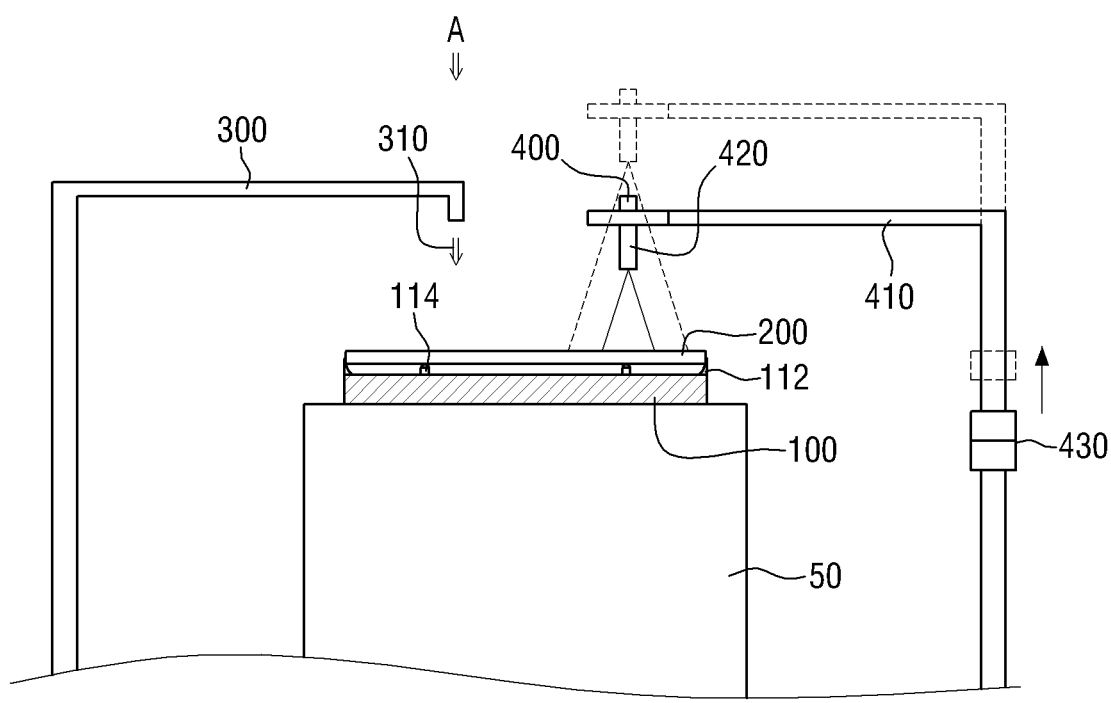
FIG. 10 is a side view for explaining in detail a position adjusting device of a support arm shown in FIG. 9.

FIG. 9 is a side view for explaining a configuration of a wafer cleaning device according to an exemplary embodiment and FIG. 10 is a side view for explaining in detail a position adjusting device of a support arm 410 shown in FIG. 9.

Referring to FIG. 9, the spot heater 400 of the wafer cleaning device according to the exemplary embodiment may further include a vertical position adjusting device 430.

The vertical position adjusting device 430 may be installed in the support arm 410. The support arm 410 may include a vertically extending part and a horizontally extending part to support the heating source 420. The vertical position adjusting device 430 may be installed in the vertically extending part of the support arm 410.

The vertical position adjusting device 430 may vertically extend the support arm 410 and may curtail the support arm 410. The vertical position adjusting device 430 may control vertically extending part of the support arm 410 to make the heating source 420 and the wafer 200 spaced apart from each other. That is, the vertical position adjusting device 430 may adjust the vertical distance between the heating source 420 and the wafer 200.

When the vertical distance of the heating source 420 from the wafer 200 is adjusted by the vertical position adjusting device 430, a size of an area of the light irradiated by the heating source 420 may vary. That is, the size of an area of the heated spot on the wafer 200 may be adjusted by the vertical position adjusting device 430.

Referring to FIG. 10, an exemplary embodiment where the vertical position adjusting device 430 extend the vertically extending part of the support arm 410 is indicated by a dotted line. If the vertical position adjusting device 430 extends the support arm 410, the vertical position of the heating source 420 is further elevated. Because the vertical position of the wafer 200 is not changed, a distance between the wafer 200 and the heating source 420 may be increased. In such a case, the size of the area of the spot irradiated with the light irradiated from the heating source 420 may further be increased. Therefore, a size of the heated spot of the wafer 200 may be adjusted by the vertical position adjusting device 430 of the support arm 410.

A position of the spot light of the top surface of the wafer 200 may be adjusted by the support arm 410. And the spot size of the top surface of the wafer 200 may be adjusted by the vertical position adjusting device 430.

In the wafer cleaning device according to the exemplary embodiment, because the light irradiated area of the spot heater 400, that is, the spot size, is adjusted, the temperature of the top surface of the wafer 200 may be controlled more precisely. Accordingly, the etch rates of the top surface of the wafer 200 may be controlled to have a uniform distribution.

Cleaning methods of a top surface of a wafer may be classified according to the composition of a nitride layer material forming the top surface of the wafer. For example, when the nitride layer material is used just as a hard mask throughout the wafer, only the nitride layer material has to be etched. This is called a full etch. However, in a case where the nitride layer material is used as a spacer as well as the hard mask, the nitride layer material should not be entirely etched but should only be partially etched to retain some of the nitride layer material on the wafer. This is called a partial etch.

In the related art, in the full etch as described above, a distribution of etch rates may be a less important factor because the purpose of performing an etch is to remove all of the nitride layer material, and the purpose of performing the etch may be achieved by performing an over etch (i.e., beyond the full etch). Accordingly, the etch may be performed for an extended time, irrespective of the etch rate.

However, in the partial etch, a distribution of etch rates may be quite an important factor because the nitride layer material used as a spacer should remain on the wafer even after the partial etch is performed. Accordingly, the etch rate should be maintained at a uniform level so as to avoid an over etched portion of the wafer.

In the wafer cleaning device according to the exemplary embodiment, the light irradiated area of the spot heater 400 may be adjusted by the vertical position adjusting device 430 and a heating extent of the spot heater 400 may also be adjusted, thereby more elaborately controlling the temperature of the wafer 200. Therefore, the reliability of the semiconductor device manufactured on the wafer 200 can be remarkably increased.

Hereinafter, a wafer cleaning device according to an exemplary embodiment will be described with reference to FIG. 11. Substantially the same description with the previously discussed exemplary embodiments will not be repeated or will be briefly given.

Figure 11:
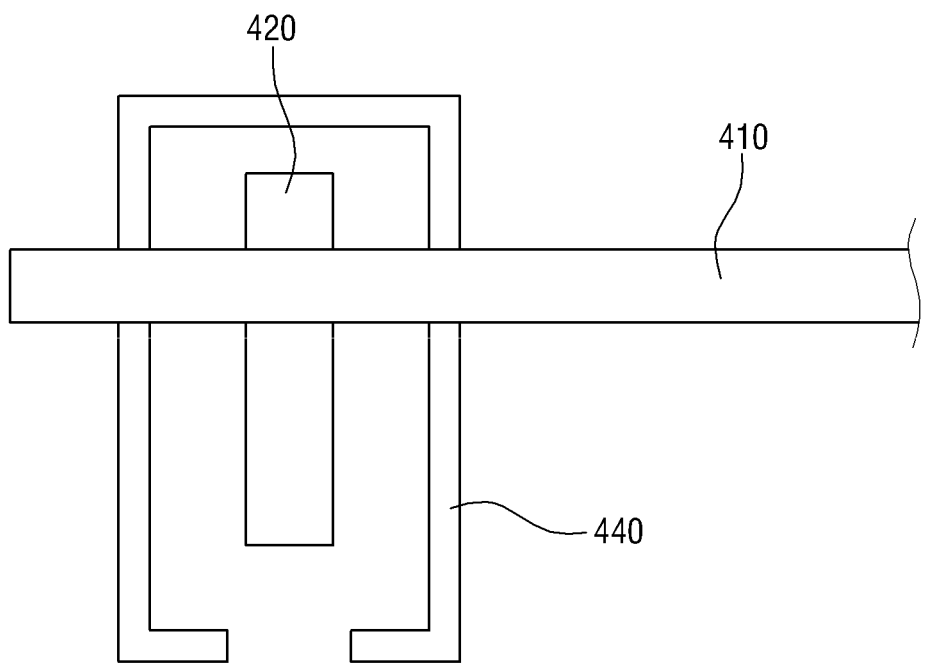
FIG. 11 is a side sectional view for explaining a cover unit of a spot heater of a wafer cleaning device according to an exemplary embodiment.

FIG. 11 is a side sectional view for explaining a cover unit 440 of a spot heater 400 of a wafer cleaning device according to an exemplary embodiment.

Referring to FIG. 11, the spot heater 400 of the wafer cleaning device according to the exemplary embodiment may further include a cover unit 440.

In the spot heater 400 of the wafer cleaning device according to the exemplary embodiment, a heating source 420 may be formed at an end of the support arm 410. In such a case, the support arm 410 can support the heating source 420 most efficiently. However, the exemplary embodiment is not limited thereto. For example, the cover unit 440 may cover the heating source 420. Accordingly, the cover unit 440 may be formed at the end of the support arm 410, like the heating source 420. However, the exemplary embodiment is not limited thereto. That is, because the cover unit 440 has only to be present at a position at which it is capable of covering the heating source 420, the position of the support arm 410 is not particularly limited.

The cover unit 440 may protect the heating source 420 to prevent the heating source 420 from being contaminated by a high-temperature chemical liquid. Because the high-temperature chemical liquid has an acidic property, corrosion of equipment may be accelerated. Therefore, the cover unit 440 may be configured to cover an outer surface of the heating source 420, except for a light irradiated portion. However, the exemplary embodiment is not limited thereto. Because the light irradiated from the heating source 420 is capable of penetrating a transparent material, and the cover unit 440 is made of such a transparent material, the cover unit 440 entirely covers the heating source 420 to be separated from the outside.

In particular, while the high-temperature chemical liquid is in a liquid phase, the chemical liquid may be evaporated by increased temperature, thereby forming a moisturized fume. The fume may shorten a lifetime of equipment. Therefore, the heating source 420 should be stayed away from not only the high-temperature chemical liquid but also the fume. Therefore, the cover unit 440 may cover the heating source 420 so as to prevent the heating source 420 from being brought into contact with the chemical liquid and the fume.

As shown in FIG. 11, the cover unit 440 may cover a portion of the heating source 420 and may include an opening through which the light is emitted. However, the exemplary embodiment is not limited thereto. For example, the cover unit 440 may entirely cover the heating source 420 and forms all or part of the opening using a transparent material to prevent heat transfer efficiency from being lowered.

Because the wafer cleaning device according to the exemplary embodiment further includes the cover unit 440, it is possible to prevent the heat transfer efficiency from being lowered while extending the lifetime of the heating source 420.

Hereinafter, a wafer cleaning device according to an exemplary embodiment will be described with reference to FIG. 12. Substantially the same description with the previously discussed exemplary embodiments will not be repeated or will be briefly given.

Figure 12:
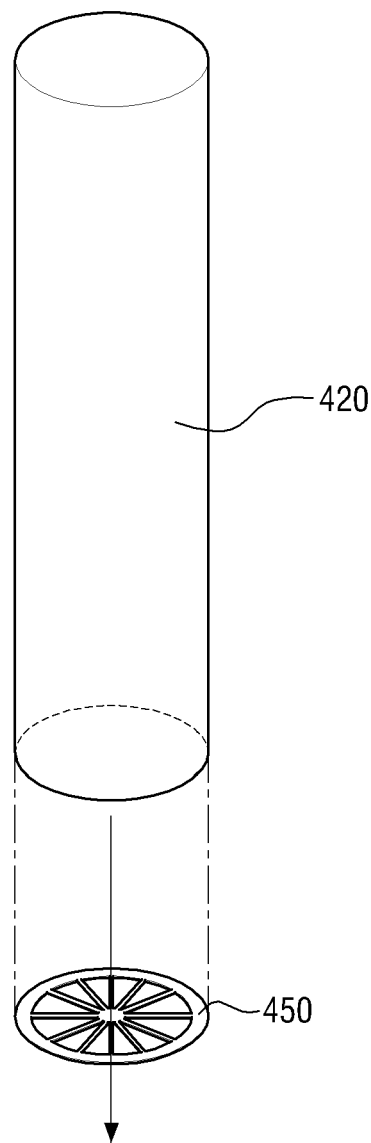
FIG. 12 is an exploded perspective view for explaining a filter of a spot heater of a wafer cleaning device according to an exemplary embodiment.

FIG. 12 is an exploded perspective view for explaining a filter 450 of a spot heater 400 of a wafer cleaning device according to an exemplary embodiment.

Referring to FIG. 12, the spot heater 400 of the wafer cleaning device according to the exemplary embodiment may further include a filter 450.

The filter 450 may be positioned on a front surface of the heating source 420 of the spot heater 400, from which the light is emitted. The filter 450 may adjust a size of a spot/a region on a top surface of a wafer 200 irradiated with the light from the heating source 420 of the spot heater 400. The filter 450 may serve as an iris capable of adjusting a size of a light passing portion.

If the spot size of the top surface of the wafer 200 is adjusted by the filter 450, the temperature of the top surface of the wafer 200 may be controlled more precisely. Accordingly, etch rates of the top surface of the wafer 200 may also be controlled to have a uniform distribution.

In the partial etch, a distribution of etch rates may be quite an important factor. Accordingly, when the distribution of etch rates is maintained at a relatively uniform level by precisely controlling the spot size using the filter 450, the reliability of the semiconductor device manufactured from the wafer 200 can be considerably increased.

In the wafer cleaning device according to the exemplary embodiment, the light irradiated area of the spot heater 400 may be adjusted by the filter 450 and heating extent of the spot heater 400 may also be adjusted, thereby more precisely controlling the temperature of the top surface of the wafer 200. Accordingly, the etch rates of the top surface of the wafer 200 can be more accurately controlled. Further, because the filter 450 is easily driven with a very small quantity of power, the spot size of the wafer 200 can be simply adjusted, thereby easily increasing the reliability of the semiconductor device manufactured on the wafer 200.

Hereinafter, a wafer cleaning device according to an exemplary embodiment will be described with reference to FIG. 13. Substantially the same description with the previously discussed exemplary embodiments will not be repeated or will be briefly given.

Figure 13:
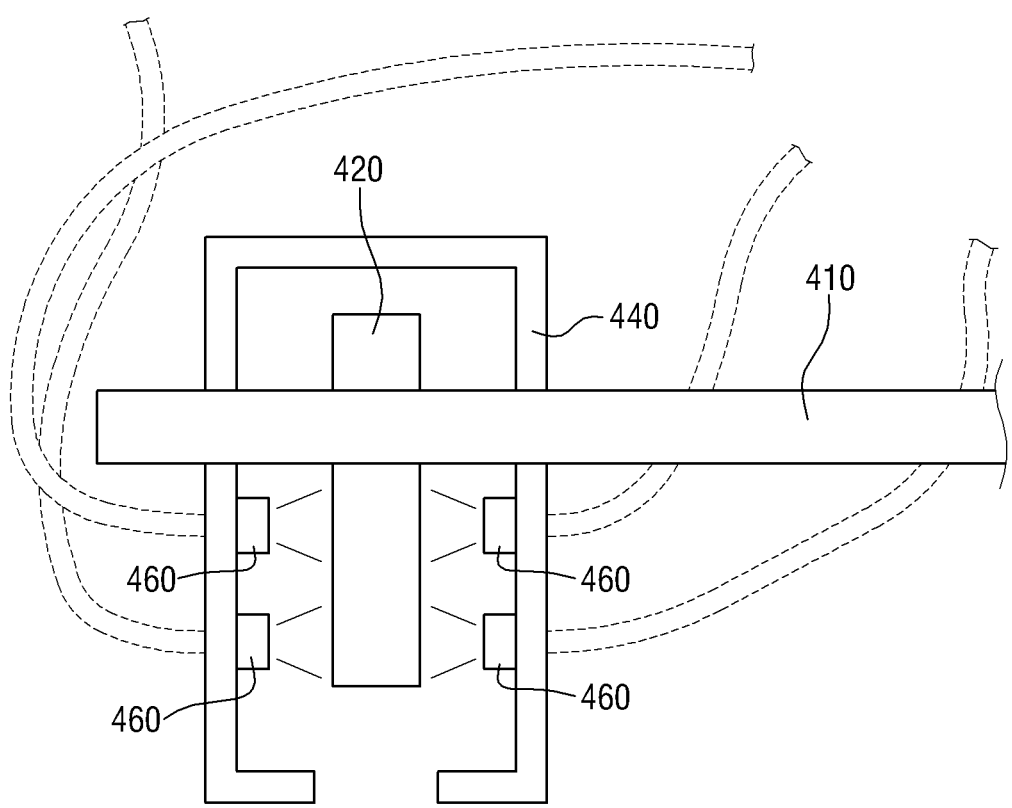
FIG. 13 is a side sectional view for explaining a purge part of a spot heater of a wafer cleaning device according to an exemplary embodiment.

FIG. 13 is a side sectional view for explaining a purge unit 460 of a spot heater 400 of a wafer cleaning device according to an exemplary embodiment.

Referring to FIG. 13, the spot heater 400 of the wafer cleaning device according to an exemplary embodiment further includes a purge unit 460.

The spot heater 400 of the wafer cleaning device according to the exemplary embodiment may include a cover unit 440. The purge unit 460 may be provided within the cover unit 440. The purge unit 460 may include a plurality of purge units. That is, the plurality of purge units 460 may be installed within the cover unit 440. The purge unit 460 may perform a purge to initialize a heating source 420 provided within the cover unit 440.

The concept of purge may be the same with cleaning. The purge unit 460 may perform a purge using, for example, nitrogen. However, the exemplary embodiment is not limited thereto. Because nitrogen gas is heavier than oxygen gas, the fume or chemical liquid contained in the purge unit 460 may be downwardly pushed. Therefore, contamination of the heating source 420 by a high-temperature chemical liquid or fume is purged to the exterior of the spot heater 400 by the purge unit 460, thereby maintaining an extended lifetime of the heating source 420.

The purge unit 460 may include a vent for spraying a gas to the heating source 420 and a cable for supplying the gas. However, the exemplary embodiment is not limited thereto. The purge unit 460 may take any type so long as it can purge the heating source 420 provided in the cover unit 440.

Hereinafter, a wafer cleaning device according to an exemplary embodiment will be described with reference to FIGS. 8, 9, 10, 12 and 14. Substantially the same description with the previously discussed exemplary embodiments will not be repeated or will be briefly given.

Figure 14:
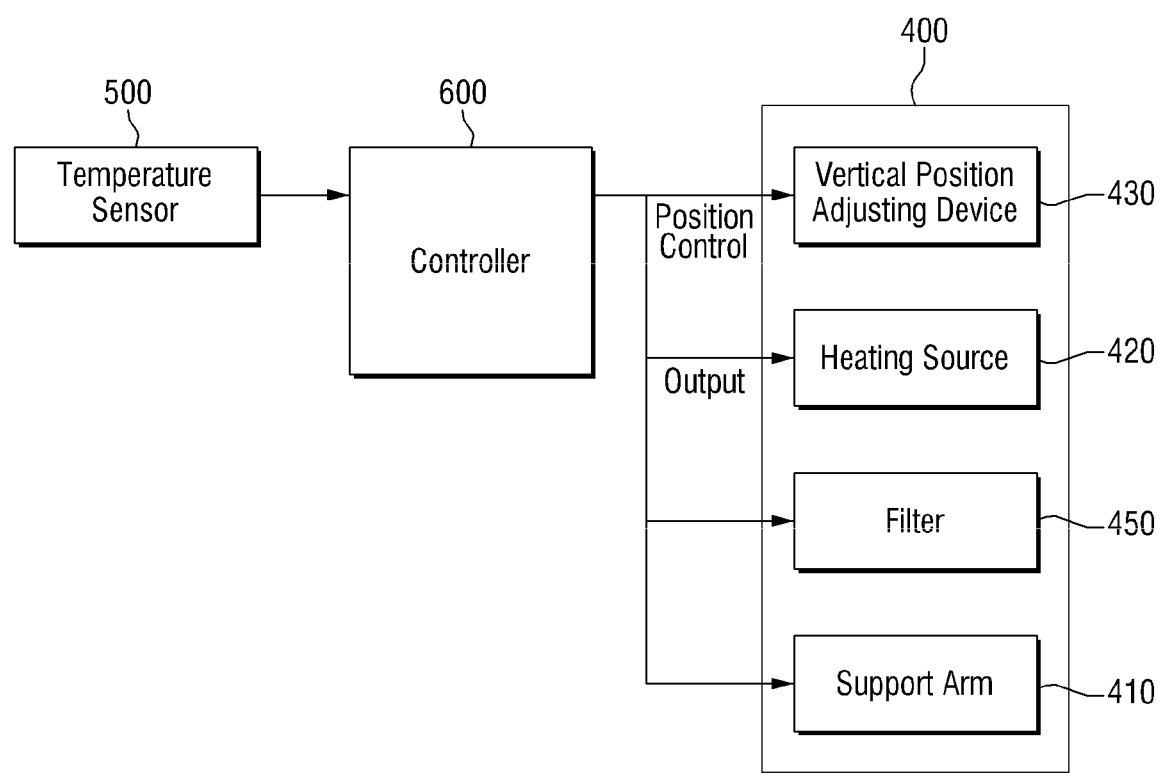
FIG. 14 is a block diagram for explaining driving mechanism of a wafer cleaning device according to an exemplary embodiment.

FIG. 14 is a block diagram for explaining driving mechanism of a wafer cleaning device according to an exemplary embodiment.

Referring to FIGS. 8, 9, 10, 12 and 14, the wafer cleaning device according to the exemplary embodiment includes a temperature sensor 500 and a controller 600.

The temperature sensor 500 may sense a temperature of a wafer 200 at different positions. The temperature sensor 500 may sense a temperature of a top surface of the wafer 200 in a real time basis. The temperature sensor 500 may transmit the real time sensed temperature to the controller 600. The temperature sensor 500 may be positioned within a heater chuck 100. However, the exemplary embodiment is not limited thereto. The temperature sensor 500 may be installed at any position without limitation so long as the temperature sensor 500 can sense the temperature of the top surface of the wafer 200.

The controller 600 may receive the real time sensed temperature from the temperature sensor 500. The controller 600 may receive all of the sensed temperatures of the top surface of the wafer 200 from the temperature sensor 500. The controller 600 may transmit a control command for controlling a spot heater 400 based on the received temperature.

The controller 600 may perform advanced process control (APC). The controller 600 may receive an etch rate profile. The controller 600 receives the etch rate profile to form the wafer 200 having the same etch rate profile with the received etch rate profile.

Figure 15:
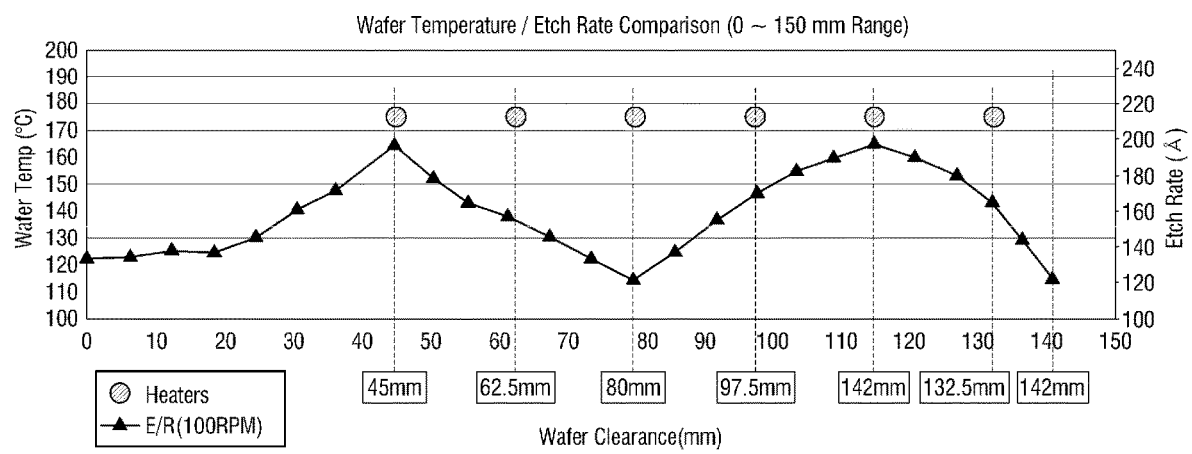
FIGS. 15 and 16 illustrate exemplary profiles of etch rates input to the wafer cleaning device shown in FIG. 14.
Figure 16:
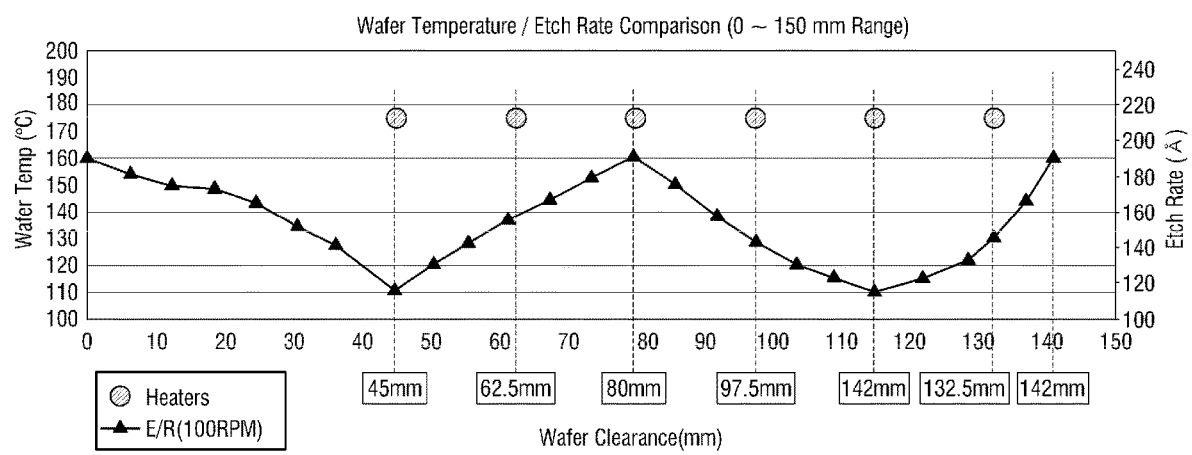

FIGS. 15 and 16 illustrate exemplary profiles of etch rates input to the wafer cleaning device shown in FIG. 14.

Referring to FIGS. 14 and 15, the wafer cleaning device according to the exemplary embodiment receives an etch rate profile having an M shape, as shown in FIG. 15, and completes the etch rate profile in the M shape. In such a case, temperatures of a wafer are adjusted using a ring heater 120 of a heater chuck 100 and a plurality of spot heaters 401 (FIG. 17), thereby forming the etch rates.

A spacer may be formed at a downwardly convex part of the M shape etch rate profile, that is, a 80 mm part, by a partial etch. That is to say, the 80 mm part may have some of a nitride layer material remaining thereon using a low etch rate. Conversely, 45 mm and 142 mm parts may be fully etched parts, so that the nitride layer material is completely removed.

Referring to FIGS. 14 and 16, the wafer cleaning device according to the exemplary embodiment receives an etch rate profile having a W shape, as shown in FIG. 16, and completes the etch rate profile in the W shape. In such a case, temperatures of a wafer are adjusted using a ring heater 120 of a heater chuck 100 and a plurality of spot heaters 401, thereby forming the etch rates.

A spacer may be formed at downwardly convex parts of the W shape etch rate profile, that is, 45 mm and 142 mm parts, by a partial etch. That is, the 45 and 142 mm parts may have some of a nitride layer material remaining thereon using a low etch rate. Conversely, an 80 mm part may be a fully etched part, so that the nitride layer material is completely removed.

The etch rate profiles of FIGS. 15 and 16 are provided only for illustration, but a desired etch rate profile may take any shape. That is, the wafer cleaning device according to the exemplary embodiment may manufacture the wafer 200 having a desired etch rate profile, irrespective of the shape of the desired etch rate profile.

In detail, a controller 600 may control a position of a vertical position adjusting device 430. The vertical position adjusting device 430 may adjust a size of a spot irradiated with light from a heating source 420 by adjusting a height of the heating source 420. Accordingly, a heated/irradiated area of a top surface of the wafer 200 and a temperature elevating extent of the heated area can be more elaborately controlled.

In addition, the controller 600 may control an output of the heating source 420. The heating source 420 may heat the top surface of the wafer 200 using light, such as laser. Therefore, the temperature of the heated spot on the top surface of the wafer 200 can be more elaborately controlled by adjusting the output and wavelength of light.

In addition, the controller 600 may control a size of a filtered area of a filter 450. The filter 450 filters the light irradiated from the heating source 420, thereby determining the size of the spot irradiated with the light on the top surface of the wafer 200. Therefore, the controller 600 controls the spot size by controlling the filtered area of the filter 450. Accordingly, the heated area of the top surface of the wafer 200 and the temperature elevating extent of the heated area can be more elaborately controlled.

In addition, the controller 600 may control a position of the support arm 410 along a horizontal plane. The support arm 410 may adjust the position of the heating source 420, thereby determining a heated part of the top surface of the wafer 200. Therefore, the controller 600 may control the position of the heating source 420 along the horizontal plane by controlling the position of the support arm 410. Accordingly, parts of the top surface of the wafer 200 to be selectively heated can be adjusted, thereby more elaborately controlling the temperature of the wafer 200.

The vertical position adjusting device 430 and the filter 450 may be simultaneously controlled or only one of the vertical position adjusting device 430 and the filter 450 may be controlled because both of the vertical position adjusting device 430 and the filter 450 are capable of adjusting the size of the irradiated spot on the wafer 200. Here, the size of the spotlight may be adjusted by the vertical position adjusting device 430 mainly and the size of the spot light may be adjusted by the filter 450 secondarily, thereby more elaborately controlling the spot size.

After the vertical position adjusting device 430, the heating source 420, the filter 450 and the support arm 410 are controlled by the controller 600, the temperature of the top surface of the wafer 200 may be newly sensed by the temperature sensor 500. The temperature sensor 500 may transmit the newly sensed temperature to the controller 600. The controller 600 may perform advanced process control (APC) based on the newly sensed temperature transmitted from the temperature sensor 500. The APC may be used to optimize the temperature of the top surface of the wafer 200.

In the wafer cleaning device according to the exemplary embodiment, the controller 600 optimizes the temperature of the top surface of the wafer 200, thereby controlling etch rates of the top surface of the wafer 200 to be uniform.

Further, in a partial etch, the etch rate of a particular part may be increased, thereby completing patterning in an intended manner.

Hereinafter, a wafer cleaning device according to an exemplary embodiment will be described with reference to FIGS. 15 to 17. Substantially the same description with the previously disclosed exemplary embodiments will not be repeated or will be briefly given.

Figure 17:
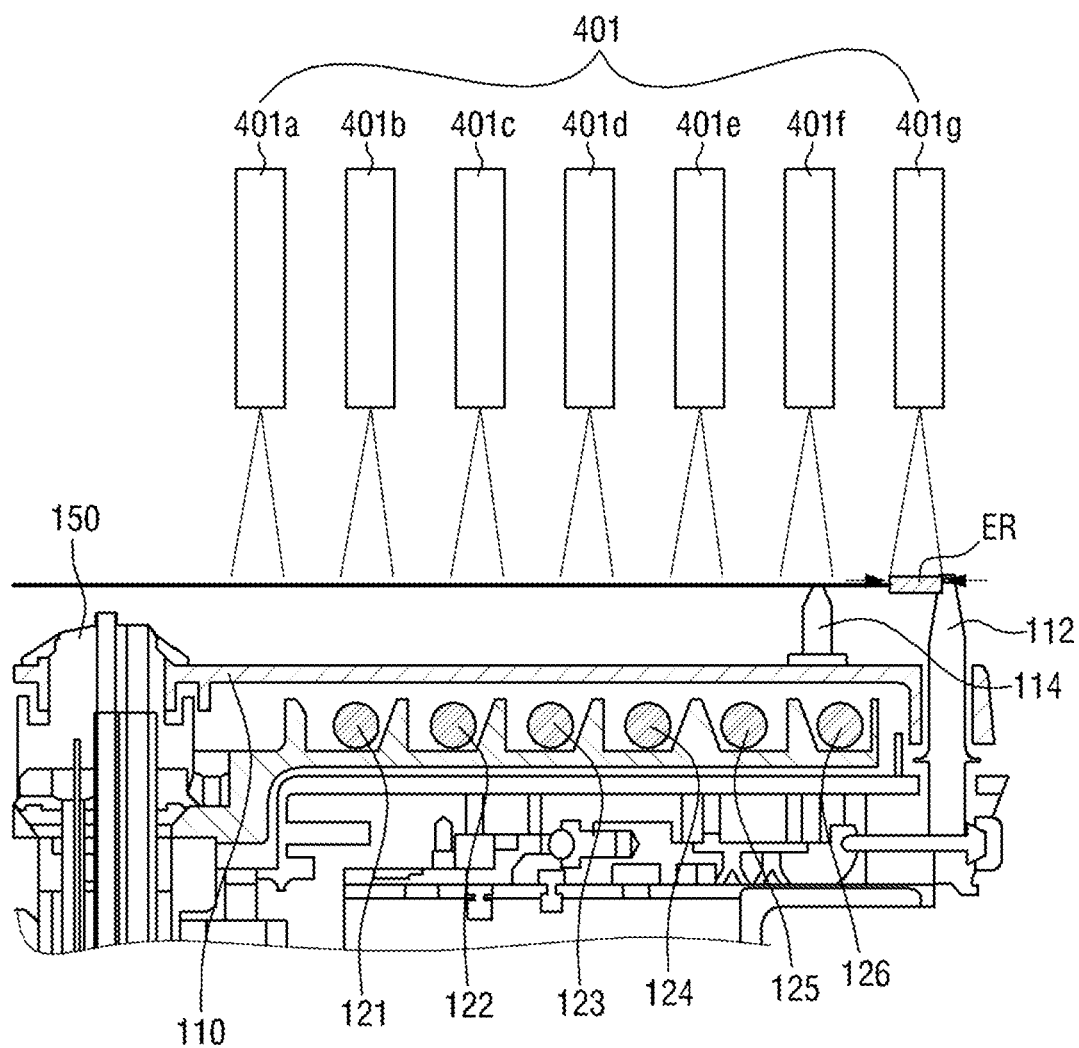
FIG. 17 is a side sectional view for explaining a wafer cleaning device according to an exemplary embodiment.

FIG. 17 is a side sectional view for explaining a wafer cleaning device according to an exemplary embodiment.

Referring to FIGS. 15 to 17, the wafer cleaning device according to the exemplary embodiment may include a plurality of spot heaters 401.

The plurality of spot heaters 401 may heat not only an edge region (ER) of a wafer 200 but also a region ranging between the center of the wafer 200 and the edge region (ER). For example, the plurality of spot heaters 401 may heat boundaries in the respective regions heated by a ring heater 120 of a heater chuck 100. However, the exemplary embodiment is not limited thereto.

In the wafer cleaning device according to the exemplary embodiment, uniformity in the etch rate distribution may be more securely guaranteed by the plurality of spot heaters 401. Further, the wafer cleaning device according to the exemplary embodiment may complete an etch rate profile having a particular shape, rather than a uniform etch rate profile.

That is, the wafer cleaning device according to the exemplary embodiment may receive the etch rate profile shown in FIGS. 15 and 16 and may manufacture a wafer 200 having the same etch rate profile with the received etch rate profile.

Because the plurality of spot heaters 401 additionally heat various spots of the top surface of the wafer 200, the temperature of the entire surface of the wafer 200 can be elaborately controlled as desired. In FIG. 17, seven (7) spot heaters 400 irradiate light into the region between the edge region (ER) and the ring heater 120 and the center of the wafer 200, provided only for illustration. That is, there is no limitation in the number of spot heaters 401. In addition, the plurality of spot heaters 401 may not be necessarily fixed at particular positions. The positions of the plurality of spot heaters 401 may vary according to the received etch rate profile.

The wafer cleaning device according to the exemplary embodiment may elaborately control the temperature of the entire surface of the wafer 200 using the heater chuck 100 and the plurality of spot heaters 401, thereby controlling the etch rate of the top surface of the wafer 200 so as to have a desired etch rate profile. The desired etch rate profile may be a uniform profile. However, the desired etch rate profile may be formed in particular shapes, as shown in FIGS. 15 and 16.

While exemplary embodiments have been particularly shown and described above, it will be understood by those of ordinary skill in the art that various changes in form and details may be made therein without departing from the spirit and scope of the present inventive concept as defined by the following claims.

What is claimed is:

1. A heater comprising:
   a heating source configured to irradiate laser light onto a wafer, to heat the wafer;
   a support arm supporting the heating source;
   a cover unit isolating the heating source from outside, and comprising a transparent material;
   a purge unit configured to remove foreign materials from the heating source, and comprising a vent configured to spray a purge gas to the heating source, the vent being disposed within an inner wall of the cover unit; and
a heater chuck on which the wafer is mounted, the heater chuck being configured to heat a bottom surface of the wafer,
wherein the heater chuck comprises:
 a top plate supporting the wafer;
 a ring heater configured to heat the top plate from underneath the top plate;
 a spin chuck assembly accommodating the ring heater; and
 a spin motor assembly positioned under the spin chuck assembly and configured to rotate the spin chuck assembly and the top plate,
wherein the spin chuck assembly comprises a first hole,
wherein the spin motor assembly comprises a second hole aligned with the first hole, and
wherein the heater chuck further comprises a fixing shaft coupled to the ring heater and passing through the first hole and the second hole.

2. The heater of claim 1, wherein the laser light penetrates the cover unit.

3. The heater of claim 1, further comprising a filter interposed between the heating source and the wafer, and configured to be an iris.

4. The heater of claim 3, wherein the filter is further configured to filter the laser light, to adjust a size of a spot of the wafer that is heated.

5. The heater of claim 1, wherein the purge unit further comprises a cable configured to supply the purge gas.

6. The heater of claim 1, wherein the purge gas comprises nitrogen gas.

7. A device for cleaning a wafer, the device comprising:
a chemical liquid nozzle configured to spray a chemical liquid on a top surface of the wafer, for etching;
a heater,
wherein the heater comprises:
 a heating source configured to heat the wafer;
 a support arm supporting the heating source;
 a cover unit isolating the heating source from outside, and comprising a transparent material; and
 a purge unit configured to remove foreign materials from the heating source, and comprising a vent configured to spray a purge gas to the heating source, the vent being disposed within an inner wall of the cover unit; and
a heater chuck on which the wafer is mounted, the heater chuck being configured to heat a bottom surface of the wafer,
wherein the heater chuck comprises:
 a top plate supporting the wafer;
 a ring heater configured to heat the top plate from underneath the top plate;
 a spin chuck assembly accommodating the ring heater; and
 a spin motor assembly positioned under the spin chuck assembly and configured to rotate the spin chuck assembly and the top plate,
wherein the spin chuck assembly comprises a first hole,
wherein the spin motor assembly comprises a second hole aligned with the first hole, and
wherein the heater chuck further comprises a fixing shaft coupled to the ring heater and passing through the first hole and the second hole.

8. The device of claim 7, wherein the heating source is further configured to irradiate laser light onto the wafer, to heat the wafer.

9. The device of claim 8, wherein the laser light has a wavelength in a near infrared (NIR) region.

10. The device of claim 8, wherein the laser light penetrates the cover unit.

11. The device of claim 7, wherein the purge gas comprises nitrogen gas.

12. The heater of claim 7, wherein the fixing shaft and the ring heater are fixedly attached while the spin motor assembly and the spin chuck assembly rotate.

* * * * *